(12) United States Patent
Ma et al.

(10) Patent No.: US 12,424,499 B2
(45) Date of Patent: Sep. 23, 2025

(54) MANUFACTURING METHOD OF SEMICONDUCTOR STRUCTURE AND SEMICONDUCTOR STRUCTURE THEREOF

(71) Applicant: TAIWAN SEMICONDUCTOR MANUFACTURING COMPANY LTD., Hsinchu (TW)

(72) Inventors: Pei-Lum Ma, Taipei (TW); Kun Da Jhong, Tainan (TW); Hsueh-Han Lu, Tainan (TW); Kun-Ei Chen, Tainan County (TW); Chen-Chieh Chiang, Kaohsiung (TW); Ling-Sung Wang, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 556 days.

(21) Appl. No.: 17/731,145

(22) Filed: Apr. 27, 2022

(65) Prior Publication Data

US 2023/0352351 A1 Nov. 2, 2023

(51) Int. Cl.
H01L 21/66 (2006.01)
H01L 23/00 (2006.01)
H10D 1/20 (2025.01)

(52) U.S. Cl.
CPC .............. *H01L 22/32* (2013.01); *H01L 22/12* (2013.01); *H01L 22/14* (2013.01); *H01L 24/02* (2013.01);

(Continued)

(58) Field of Classification Search
CPC ... H01L 21/76834; H01L 28/10; H01L 22/32; H01L 23/5227; H01L 2224/0392;
(Continued)

(56) References Cited

U.S. PATENT DOCUMENTS 6,300,234 B1 * 10/2001 Flynn ...................... H01L 24/11
257/E23.161
2006/0263727 A1 * 11/2006 Lee ...................... H01L 23/3114
430/394

(Continued)

OTHER PUBLICATIONS

Murakami, Ichiro, et al. On the Contactless Measurement of Electric Conductivity of Semiconductor Circular Wafer. Research Reports of Kanagawa Institute of Technology. Part B. Science and Technology, 1982.

(Continued)

*Primary Examiner* — Ajay Ojha
*Assistant Examiner* — Paul A Berry
(74) *Attorney, Agent, or Firm* — WPAT LAW; Anthony King

(57) ABSTRACT

A semiconductor structure is provided. The semiconductor structure includes an interconnection structure, a first conductive pad, a second conductive pad, a conductive material and a conductive coil. The first and second conductive pads are disposed over and electrically connected to the interconnection structure individually. The conductive material is electrically isolated from the interconnection structure, wherein bottom surfaces of the conductive material, the first conductive pad and the second conductive pad are substantially aligned. The conductive coil is disposed in the interconnection structure and overlapped by the conductive material. A manufacturing method of a semiconductor structure is also provided.

20 Claims, 22 Drawing Sheets

(52) U.S. Cl.
CPC .............. *H01L 24/03* (2013.01); *H01L 24/05* (2013.01); *H01L 24/06* (2013.01); *H10D 1/20* (2025.01); *H01L 2224/0235* (2013.01); *H01L 2224/03614* (2013.01); *H01L 2224/03622* (2013.01); *H01L 2224/0363* (2013.01); *H01L 2224/0391* (2013.01); *H01L 2224/0392* (2013.01); *H01L 2224/05012* (2013.01); *H01L 2224/05013* (2013.01); *H01L 2224/05015* (2013.01); *H01L 2224/05073* (2013.01); *H01L 2224/05564* (2013.01); *H01L 2224/05573* (2013.01); *H01L 2224/05686* (2013.01); *H01L 2224/0603* (2013.01); *H01L 2224/06515* (2013.01)

(58) Field of Classification Search
CPC ......... H01L 22/00; H01L 22/10; H01L 22/20; H01L 21/768; H01L 21/7681; H01L 23/645; G01N 27/00; H10D 1/20
See application file for complete search history.

(56) References Cited

U.S. PATENT DOCUMENTS

| | | | |
|---|---|---|---|
| 2015/0162744 A1* | 6/2015 | Liu | H01F 27/29 361/111 |
| 2015/0214162 A1* | 7/2015 | Lai | H01L 24/13 257/738 |
| 2018/0238936 A1* | 8/2018 | Park | H01F 27/292 |
| 2018/0308795 A1* | 10/2018 | Uchida | H10D 1/20 |
| 2020/0006244 A1* | 1/2020 | Sciriha | H01L 23/5225 |

OTHER PUBLICATIONS

Horiguchi, Fumio; Furukawas, Seijiro; Sugii, Toshihiro. Contactless measurement of sheet conductivity and mobility of semiconductor wafer by using eddy curent. Electronics and Communications in Japan (Part I: Communications), 1980, 63.2: 79-88.

\* cited by examiner

MANUFACTURING METHOD OF SEMICONDUCTOR STRUCTURE AND SEMICONDUCTOR STRUCTURE THEREOF

BACKGROUND

Semiconductor devices are used in a variety of electronic applications, such as personal computers, cellular phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Different stages of a manufacturing process of a semiconductor structure can be performed in different chambers or by different companies in different industries. As the semiconductor industry has progressed into advanced technology process nodes in pursuit of greater device density, higher performance, and smaller size of a final product, challenges of precise control of formation of elements formed during the manufacturing process have arisen.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, dimensions of the various features may be arbitrarily increased or reduced for clarity of discussion.

DETAILED DESCRIPTION

Figure 1:
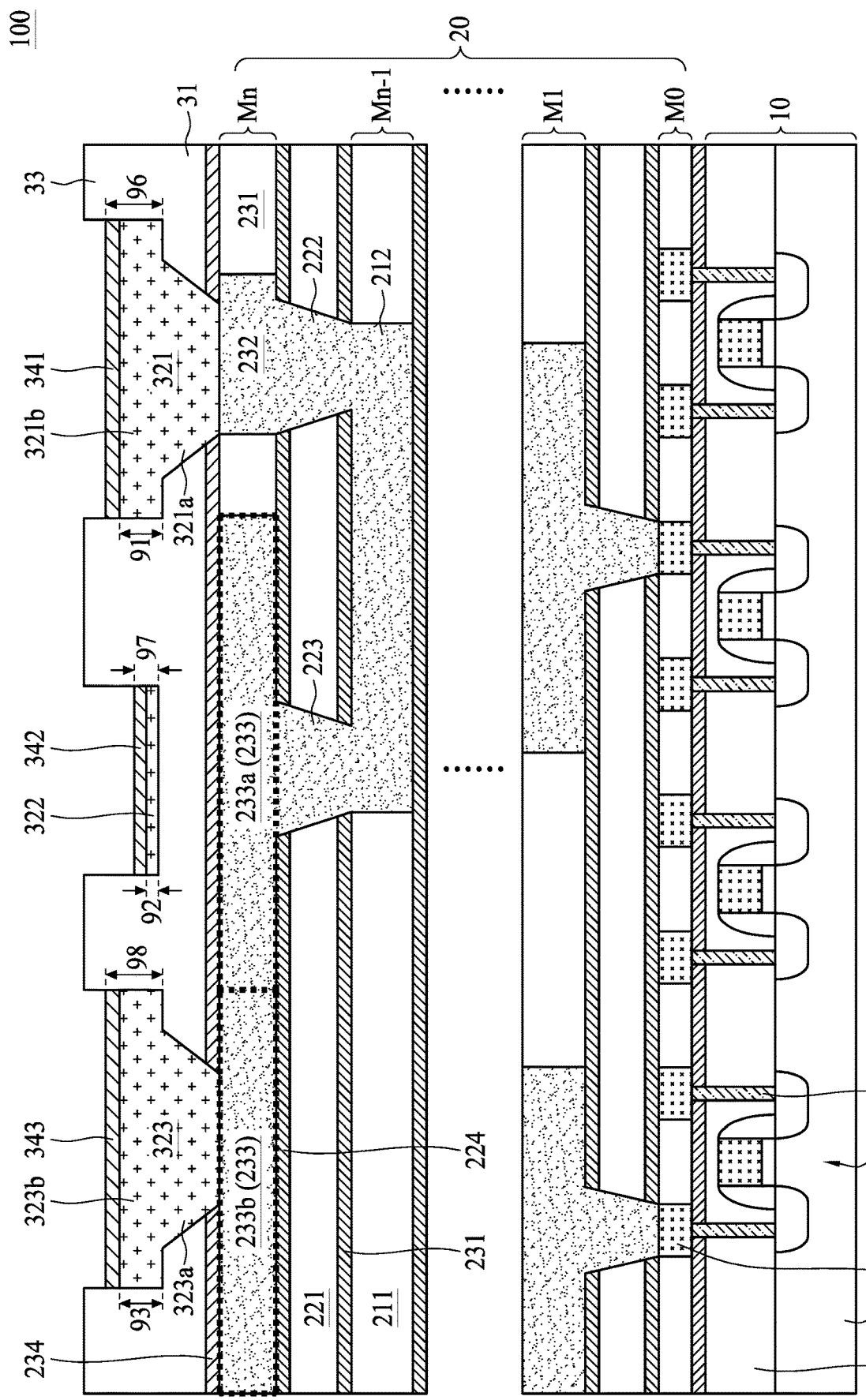
FIG. 1 is a schematic cross-sectional diagram of a semiconductor structure in accordance with some embodiments of the disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a schematic cross-sectional diagram of a semiconductor structure 100 in accordance with some embodiments of the present disclosure. The semiconductor structure 100 may include an interconnection structure 20 disposed or formed over a substrate 10. In some embodiments, the substrate 10 includes a semiconductive layer 11, a plurality of electrical components 12, and an insulating layer 13. In some embodiments, the insulating layer 13 is formed over the semiconductive layer 11 and covers the electrical components 12. In some embodiment, the semiconductive layer 11 includes a bulk semiconductor material, such as silicon. In some embodiment, the substrate 10 includes other semiconductor materials, such as silicon germanium, silicon carbide, gallium arsenide, or the like. The semiconductive layer 11 may be of a first conductivity type, e.g., a P-type semiconductive substrate (acceptor type), or a second conductivity type, e.g., an N-type semiconductive substrate (donor type). Alternatively, the semiconductive layer 11 may include another elementary semiconductor, such as germanium; a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. In some embodiment, the semiconductive layer 11 includes a semiconductor-on-insulator (SOI). In some embodiments, the semiconductive layer 11 includes a doped epitaxial layer, a gradient semiconductor layer, a semiconductor layer overlaying another semiconductor layer of a different type, such as a silicon layer on a silicon germanium layer, or a combination thereof.

The plurality of electrical components 12 may be formed on the semiconductive layer 11 following conventional methods of manufacturing semiconductors. The electrical components 12 can be active components or devices, and may include different types or generations of devices. The electrical components 12 can include a planar transistor, a multi-gate transistor, a gate-all-around field-effect transistor (GAAFET), a fin field-effect transistor (FinFET), a vertical transistor, a nanosheet transistor, a nanowire transistor, a passive device, a capacitor, or a combination thereof. For a purpose of simplicity, multiple planar transistors are depicted in FIG. 1 as an exemplary embodiment of the plurality of electrical components 12, but such depiction is not intended to limit the present disclosure.

The substrate 10 may further include the insulating layer 13 formed over the semiconductive layer 11 and a plurality of contacts 14 formed in the insulating layer 13. In some embodiments, each of the contacts 14 is connected to a source region, a drain region or a gate region of a transistor (which can be one of the electrical components 12). The plurality of contacts 14 may provide electrical connection between the electrical components and a metal line layer M0 disposed over the insulating layer 13. In some embodiments, the contacts 14 are electrically connected to corresponding metal lines 15 in the metal line layer M0. In some embodiments, the metal line layer M0 of the interconnection structure 20 is a first metal line layer above the contacts 14.

The interconnection structure 20 may include multiple metal line layers M0 to Mn, wherein n is a positive integer greater than 1. The interconnection structure 20 may further include multiple metal via layers arranged alternately between the metal line layers for electrical connection between the metal line layers. In some embodiments, each metal line layer is formed of metal lines and an intermetal dielectric (IMD) layer surrounding the metal lines. In some embodiments, each metal via layer is formed of metal vias and an IMD layer surrounding the metal vias.

The semiconductor structure 100 further includes a conductive coil 233a disposed in the interconnection structure 20. In some embodiments, the conductive coil 233a is disposed in the metal line layer Mn. In some embodiments, the metal line layer Mn is a topmost metal line layer of the interconnection structure 20. In some embodiments, the conductive coil 233a is electrically connected to a metal line 233b in the same metal line layer Mn and a metal via 223 disposed below the conductive coil 233a. In some embodiments, the conductive coil 233a is physically connected to the metal line 233b. In some embodiments, the metal via 223 is electrically connected to a metal line 233 in the metal line layer Mn through a metal line 212 in the metal line layer Mn−1 and a metal via 232 disposed between the metal line 232 and the metal line 212. In some embodiments, the metal line layer Mn−1 is a first metal line layer below the metal line layer Mn. In some embodiments, the metal line 212 is in the Mn−1 metal line layer.

The semiconductor structure 100 further includes conductive terminals 321 and 323. In some embodiments, the conductive terminals 321 and 323 are two of multiple conductive terminals disposed over the interconnection structure 20. In some embodiments, the conductive terminals 321 and 323 are electrically connected through the metal line 233b, the conductive coil 233a, the metal via 223, the metal line 212, the metal via 222 and the metal line 232. In some embodiments, each of the multiple conductive terminals 321 and 323 includes a pad portion and a via portion disposed below and connected to the pad portion. In some embodiments, the conductive terminal 321 includes a pad portion 321b and a via portion 321a, and the conductive terminal 323 includes a pad portion 323b and a via portion 323a. In some embodiments, a thickness 91 of the pad portion 321b is substantially equal to a thickness 93 of the pad portion 323b. In some embodiments, the thickness 91 or the thickness 93 is in a range of 100 to 3000 nanometers (nm).

The semiconductor structure 100 further includes a conductive material 322. In some embodiments, the conductive material 322 is disposed vertically over the conductive coil 233a. In some embodiments, the conductive material 322 is electrically isolated from the interconnection structure 20 and/or the conductive terminals 321 and 323. In some embodiments, the conductive material 322 is physically separated from the interconnection structure 20 and/or the conductive terminals 321 and 323. In some embodiments, the conductive material 322 is within a coverage area of the conductive coil 233a. In other words, the conductive material 322 overlaps the conductive coil 233a. In some embodiments, the conductive material 322 is disposed between the conductive terminals 321 and 323. In some embodiments, bottom surfaces of the conductive material 322 and the pad portions 321b and 323b are substantially aligned. In some embodiments, a thickness 92 of the conductive material 322 is substantially less than the thickness 91 or the thickness 93. In some embodiments, the thickness 92 of the conductive material 322 is in a range of 1 to 300 nm. Thus a top surface of the conductive material 322 is lower than top surfaces of the conductive terminals 321 and 323. In some embodiments, the conductive terminals 321 and 323 are configured to provide electrical connection to the conductive coil 233a for a purpose of measuring an induced current in the conductive coil 233a.

The semiconductor structure 100 may further include one or more oxide layers disposed over the conductive material 322 and/or the conductive terminals 321 and 323. In some embodiments, an oxide layer 341 is disposed on a top of the conductive terminal 321. In some embodiments, an oxide layer 342 is disposed on a top of the conductive material 322. In some embodiments, an oxide layer 343 is disposed on a top of the conductive terminal 323. In some embodiments, thicknesses of the oxide layers 341, 342 and 342 are substantially equal. In some embodiments, the thickness of the oxide layer 341, 342 or 343 is in a range of 1 to 100 nm. In some embodiments, a ratio of a total thickness 97 of the thickness 92 and the thickness of the oxide layer 342 to the thickness of the oxide layer 342 is designed to be in a range of 1:1 to 30:1. In some embodiments, the ratio of the total thickness 97 to the thickness of the oxide layer 342 is designed to be in a range of 2:1 to 20:1.

It should be noted that the structure shown in FIG. 1 is for a purpose of illustration. In some embodiments, the conductive coil 233a is disposed in a die region surrounded by a scribe line region. In some embodiments, the conductive coil 233a overlaps (or vertically covers) one or more of the electrical components 12 in the substrate 10. In some embodiments, the conductive coil 233a is disposed in the scribe line region. The conductive coil 233a may be non-overlapping (or not vertically over) any of transistors in the substrate 10.

Figure 2:
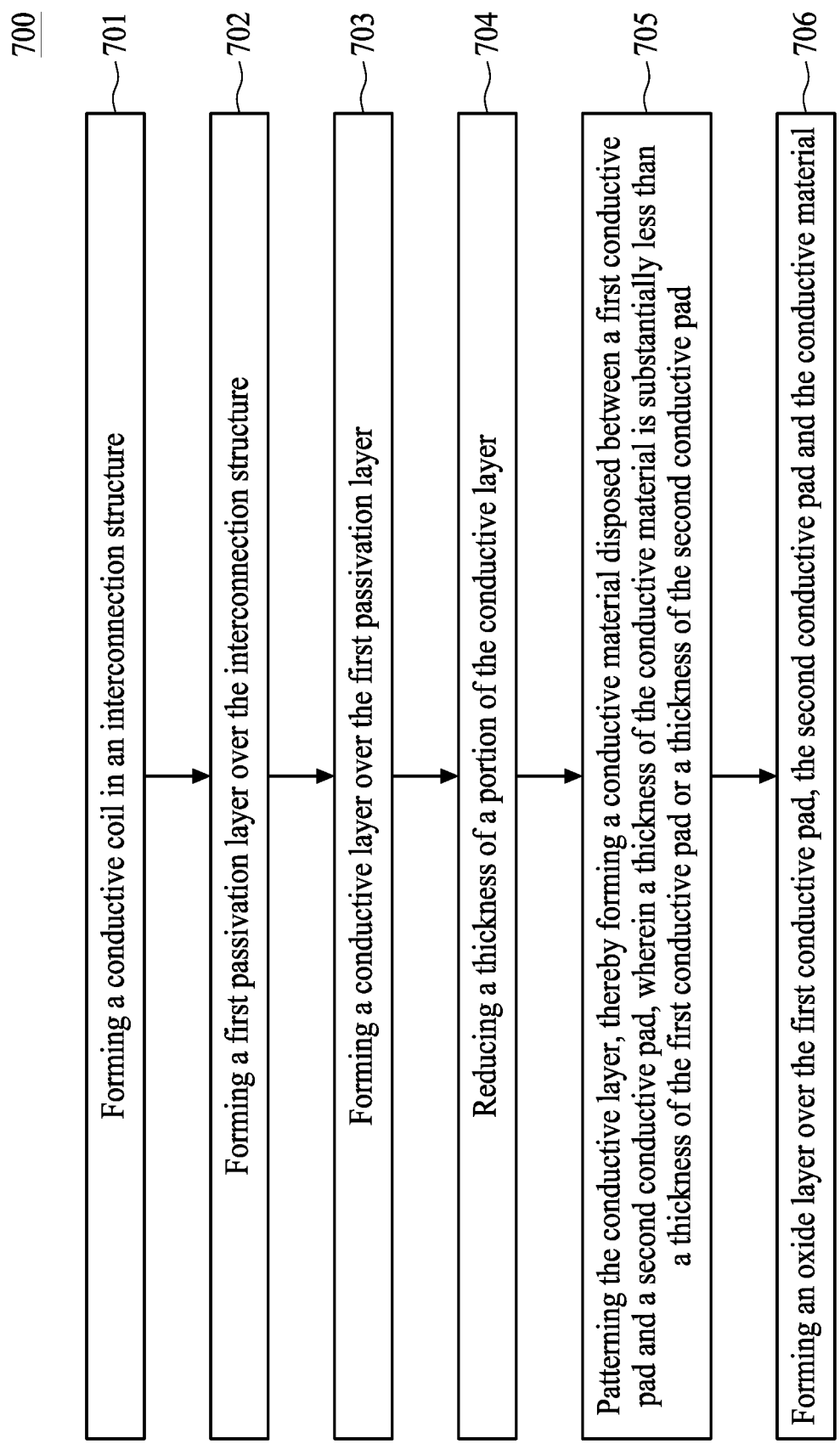
FIG. 2 is a flow diagram of a method of manufacturing a semiconductor structure in accordance with some embodiments of the disclosure.

FIG. 2 is a flow diagram of a method 700 for manufacturing a semiconductor structure in accordance with some embodiments of the present disclosure. The method 700 includes a number of operations (701, 702, 703, 704, 705 and 706) and the description and illustration are not deemed as a limitation to the sequence of the operations. A conductive coil is formed in an interconnection structure in the operation 701. A first passivation layer is formed over the interconnection structure in the operation 702. A conductive layer is formed over the first passivation layer in the operation 703. A thickness of a portion of the conductive layer is reduced in the operation 704. The conductive layer is then patterned, thereby forming a conductive material disposed between a first conductive pad and a second conductive pad in the operation 705, wherein a thickness of the conductive material is substantially less than a thickness of the first conductive pad or a thickness of the second conductive pad. An oxide layer is formed over the first conductive pad, the second conductive pad and the conductive material in the operation 706. It should be noted that the operations of the method 700 may be rearranged or otherwise modified within the scope of the various aspects. Additional processes may be provided before, during, and after the method 700, and some other processes may be only briefly described herein. Thus, other implementations are possible within the scope of the various aspects described herein.

Figure 3:
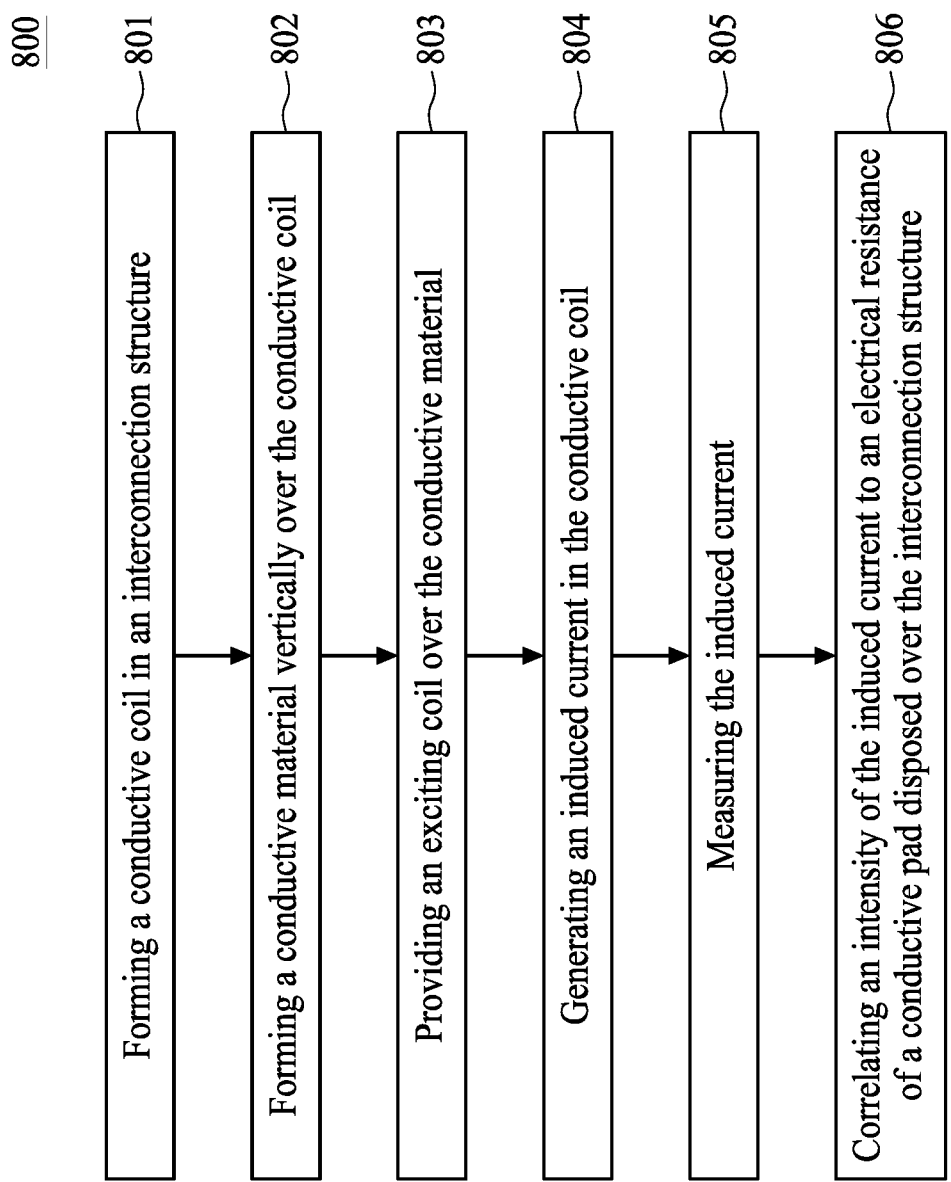
FIG. 3 is a flow diagram of a method of manufacturing a semiconductor structure in accordance with some embodiments of the disclosure.

FIG. 3 is a flow diagram of a method 800 for manufacturing a semiconductor structure in accordance with some embodiments of the present disclosure. The method 800 includes a number of operations (801, 802, 803, 804, 805 and 806) and the description and illustration are not deemed as a limitation to the sequence of the operations. A conductive coil is formed in an interconnection structure in the operation 801. A conductive material is formed vertically over the conductive coil in the operation 802. An exciting coil is provided over the conductive material in the operation 803. An induced current in generated in the conductive coil in the operation 804. The induced current is measured in the operation 805. An intensity of the induced current is correlated to an electrical resistance of a conductive pad disposed over the interconnection structure in the operation 806. It should be noted that the operations of the method 800 may be rearranged or otherwise modified within the scope of the various aspects. Additional processes may be provided before, during, and after the method 800, and some other processes may be only briefly described herein. Thus, other implementations are possible within the scope of the various aspects described herein.

The method 700 and the method 800 are within a same concept of the present disclosure, and in order to further illustrate details of the method 700, the method 800, and the concept of the present disclosure, the method 700 and the method 800 are comprehensively illustrated with embodiments of the present disclosure. For ease of illustration, reference numerals with similar or same functions and properties are repeated in different embodiments and figures. For simplicity of the figures, the substrate 10 and a portion of the interconnection structure 20 below the metal line layer Mn−1 are omitted from the following figures. However, such omission is not intended to limit the present disclosure.

Figure 4:
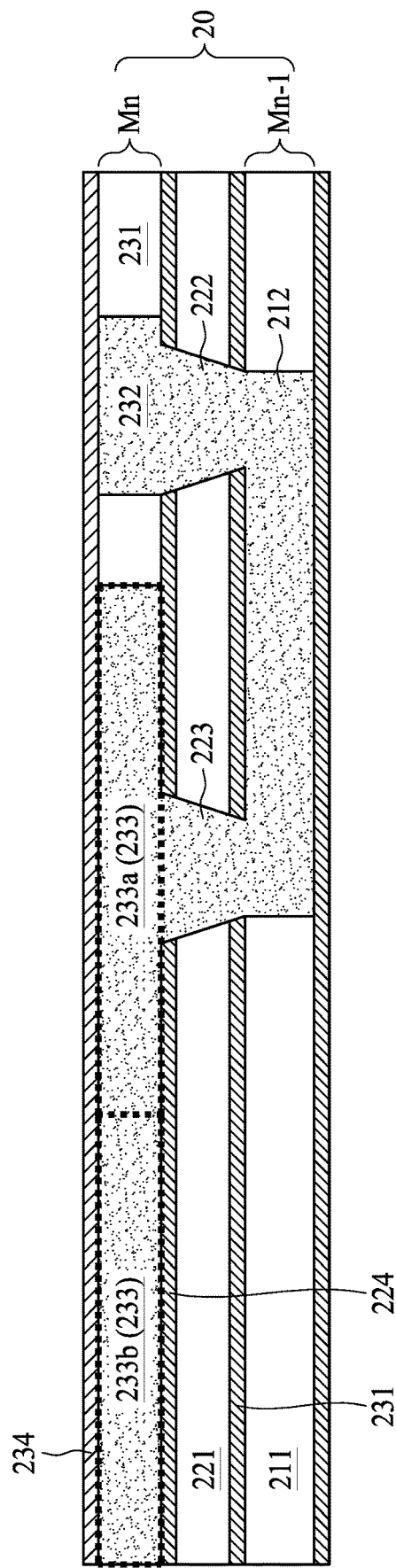
FIG. 4 is a schematic cross-sectional diagram of a semiconductor structure at a stage of a manufacturing method in accordance with some embodiments of the disclosure.

Please refer to FIG. 4, which is a schematic cross-sectional diagram of a semiconductor structure at a stage of the method 700 and/or a stage of the method 800 in accordance with some embodiments of the present disclosure. In the operation 701 and/or the operation 801, a conductive coil 233a is formed in an interconnection structure 20. In some embodiments, the conductive coil 233a is formed in a metal line layer Mn. In some embodiments, the conductive coil 233a is formed prior to or after formation of metal lines 233b and 232 in the metal line layer Mn. In some embodiments, the conductive coil 233a is formed concurrently with the metal lines 233b and 232. In some embodiments, the conductive coil 233a is formed after formation of metal vias 222 and 223 and/or formation of an IMD layer 221 surrounding the metal vias 222 and 223. In some embodiments, the metal vias 222 and 223 are formed concurrently with the metal lines 233b and 232 and/or the conductive coil 233a. In some embodiments, the IMD layer 221 is formed prior to the formation of the metal vias 222 and 223. In some embodiments, the metal vias 222 and 223 and the IMD layer 221 are formed after formation of a metal line 212 and formation of an IMD layer 211 surrounding the metal line 212. In some embodiments, the metal line 212 is formed after formation of the IMD layer 211. In some embodiments, an etch stop layer 234 is formed over the metal line layer Mn. A material of the conductive coil 233a can be different from or same as that of the metal lines 233b and 232. In some embodiments, the material of the conductive coil 233a and/or the metal lines 233b and 232 includes aluminum (Al), copper (Cu), tungsten (W), titanium (Ti), tantalum (Ta), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), titanium nitride (TiN), tungsten nitride (WN), tantalum nitride (TaN), ruthenium (Ru), titanium silicon nitride (TiSiN), or other suitable materials.

Figure 5B:
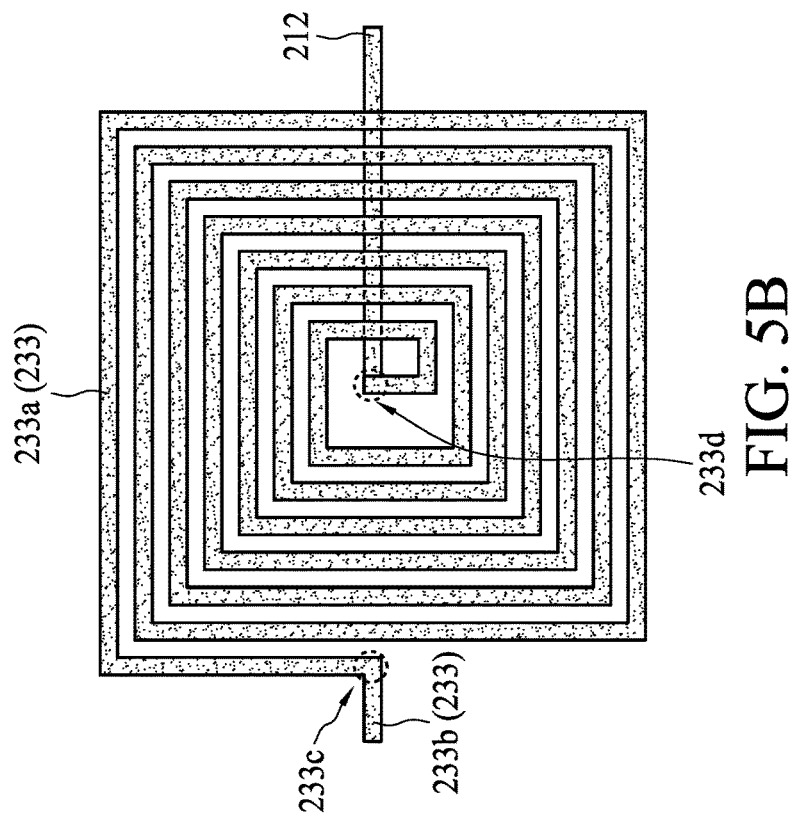
FIGS. 5A and 5B are schematic top view perspectives of a conductive coil and metal lines connected to the conductive coil of a semiconductor structure in accordance with different embodiments of the disclosure.
Figure 5A:
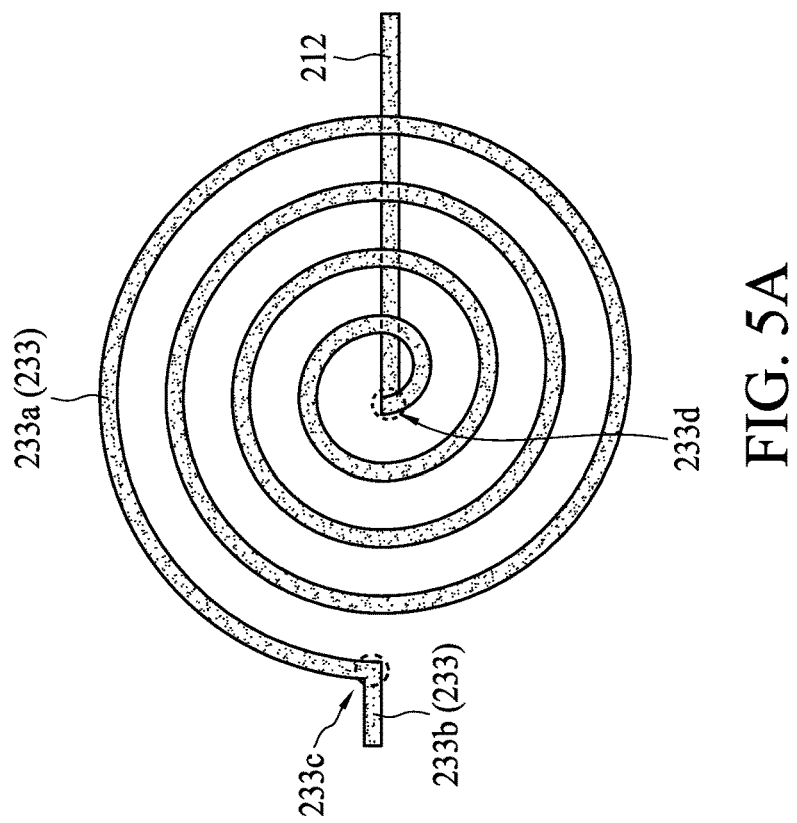

Please refer to FIGS. 5A and 5B, which are schematic top view perspectives of the conductive coil 233a and the metal lines 233b and 212 of the semiconductor structure in accordance with different embodiments of the present disclosure. The conductive coil 233a may be an opened coil and include two ends electrically connected to the metal lines 233b and 212 respectively. In some embodiments as shown in FIG. 5A, the conductive coil 233a is a circular coil. In some embodiments, an outer end 233c of the conductive coil 233a connects to the metal line 233b. In some embodiments, the outer end 233c of the conductive coil 233a is in physical contact with the metal line 233b. In some embodiments, the conductive coil 233a and the metal line 233b are a monolithic structure. In some embodiments, an inner end 233d of the conductive coil 233a electrically connects to the metal line 212 (shown in a dashed line) through the metal via 223 (not shown in FIGS. 5A and 5B). In some embodiments, the metal via 223 is overlapped by the inner end 233*d* of the conductive coil 233*a*. In some embodiments as shown in FIG. 5B, the conductive coil 233*a* is a rectangular coil. An arrangement of the conductive coil 233*a*, the metal line 233*b*, the metal via 223 and the metal line 212 of the embodiments shown in FIG. 5B can be similar to those as shown in FIG. 5A, and repeated description is omitted herein. It should be noted that the embodiments shown in FIGS. 5A and 5B are provided as exemplary embodiments. The conductive coil 233*a* can be in other shapes, such as triangles, hexagons, octagons, and so forth. The shape of the conductive coil 233*a* is not limited herein.

Figure 6:
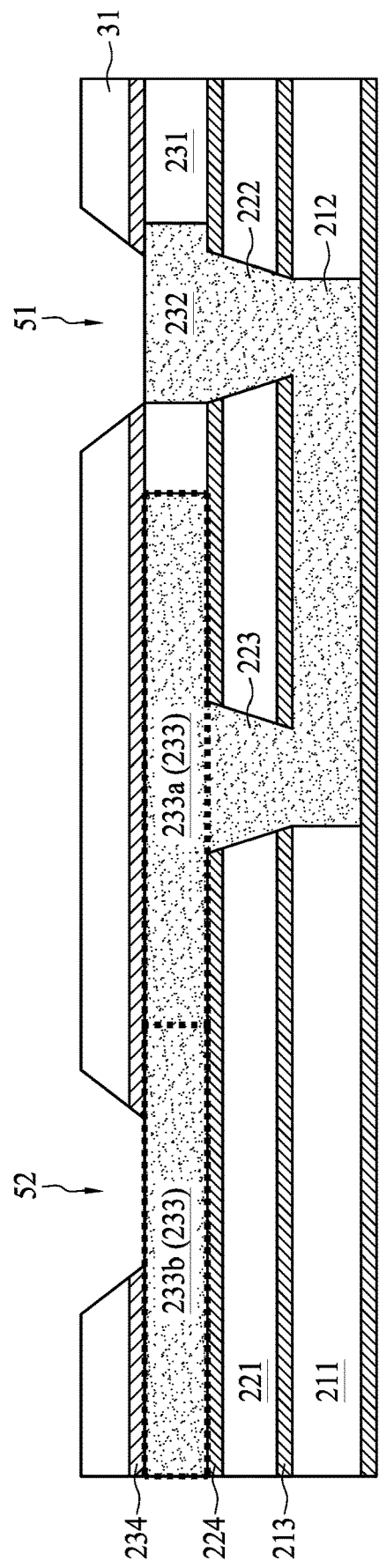
FIGS. 6 to 12 are schematic cross-sectional diagrams of a semiconductor structure at different stages of a manufacturing method in accordance with some embodiments of the disclosure.

Please refer to FIG. 6, which is a schematic cross-sectional diagram of the semiconductor structure at a stage of the method 700 and/or a stage of the method 800 in accordance with some embodiments of the present disclosure. In the operation 702 and/or after the operation 801, a passivation layer 31 is formed over the etch stop layer 234. In some embodiments, the passivation layer 31 is formed by a deposition operation. In some embodiments, the deposition operation includes a chemical vapor deposition (CVD), a physical vapor deposition (PVD), an atomic layer deposition (ALD), a low-pressure chemical vapor deposition (LPCVD), a plasma-enhanced CVD (PECVD), or a combination thereof.

After the formation of the passivation layer 31, a portion of the metal line 233*b* and a portion of the metal line 232 may be exposed. In some embodiments, a patterning operation is performed to remove portions of the passivation layer 31, thereby forming openings 51 and 52. In some embodiments, the portion of the metal line 233*b* is exposed by the opening 52 and the portion of the metal line 232 is exposed by the opening 51. In some embodiments, the patterning operation includes one or more etching operations. In some embodiments, the etching operation includes a dry etching operation, a wet etching operation, or a combination thereof. In some embodiments, the dry etching operation includes an ion beam etching (IBE), a reactive ion etching (RIE), a directional plasma etching, or a combination thereof. In some embodiments, an etching rate of the etching operation on the passivation layer 31 is greater than an etching rate of the etching operation on the etch stop layer 234. In some embodiments, a detection of a material of the etch stop layer 234 at an etched surface is performed after a certain duration of the etching operation. In some embodiments, portions of the etch stop layer 234 are also removed by the etching operation. A result of the detection can indicate the exposure of the metal lines 233*b* and 232. In some embodiments, the openings 51 and 52 are defined by the remaining passivation layer 31 and the remaining etch stop layer 234.

Figure 7:
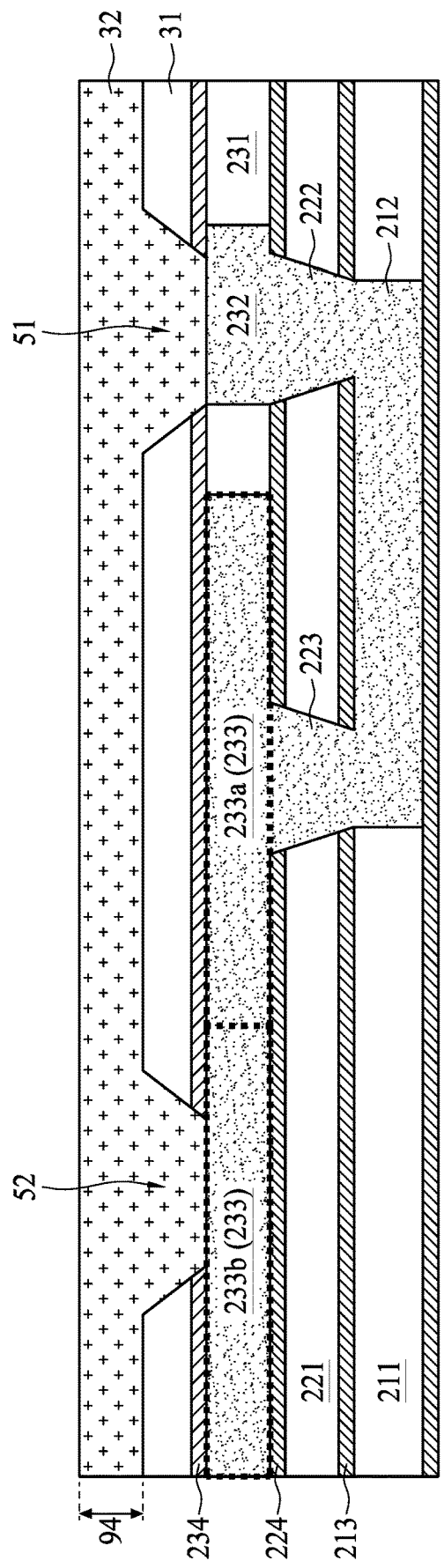
Figure 8:
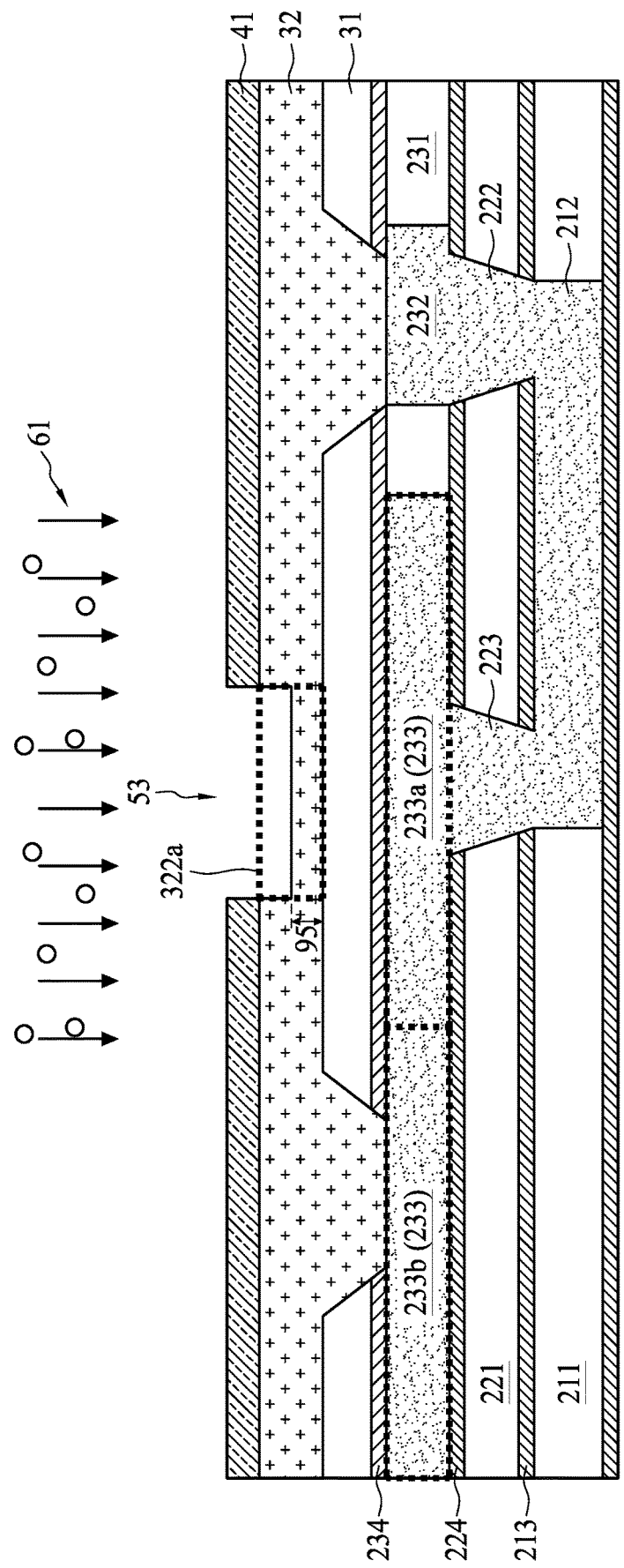

Please refer to FIG. 7, which is a schematic cross-sectional diagram of the semiconductor structure at a stage of the method 700 and/or a stage of the method 800 in accordance with some embodiments of the present disclosure. In the operation 703 and/or after the formation of the openings 51 and 52, a conductive layer 32 is formed over the passivation layer 31. In some embodiments, the conductive layer 32 fills the openings 51 and 52. In some embodiments, the conductive layer 32 is electrically connected to the metal lines 233*b* and 232. In some embodiments, the conductive layer 32 contacts the exposed portions of the metal lines 233*b* and 232. In some embodiments, a material of the conductive layer 32 includes aluminum (Al), copper (Cu), tungsten (W), titanium (Ti), tantalum (Ta), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), titanium nitride (TiN), tungsten nitride (WN), tantalum nitride (TaN), ruthenium (Ru), titanium silicon nitride (TiSiN), or other suitable materials. The material of the conductive layer 32 can be same as or different from that of the conductive coil 233*a* and/or that of the metal lines 233*b* and 232. In some embodiments, the material of the conductive layer 32 is different from those of the conductive coil 233*a* and the metal lines 233*b* and 232. As shown in FIG. 8, the openings 51 and 52 are filled with the conductive layer 32. Further, the conductive layer 32 covers top surfaces of the passivation layer 31. In some embodiments, a thickness 94 of a portion of the conductive layer 32 above the passivation layer 31 (measured from a top surface of the conductive layer 32 to a top surface of the passivation layer 31) is in a range of 100 to 4000 nm.

Please refer to FIG. 8, which is a schematic cross-sectional diagram of the semiconductor structure at a stage of the method 700 and/or a stage of the method 800 in accordance with some embodiments of the present disclosure. In the operation 704 and/or after the formation of the conductive layer 32, a thickness of a portion 322*a* (circled in a dashed line) of the conductive layer 32 disposed vertically over the conductive coil 233*a* is reduced. In some embodiments, a mask layer 41 is formed over the conductive layer 32. In some embodiments, the portion 322*a* is defined by and exposed through the mask layer 41. The mask layer 41 is configured to protect the rest portion of the conductive layer 32 covered by the mask layer 41 during an etching operation that is subsequently to be performed. The mask layer 41 can include photoresist material, nitride, oxynitride, or other suitable materials. In some embodiments, the portion 322*a* of the conductive layer 32 is exposed through the mask layer 41. In some embodiments, the portion 322*a* of the conductive layer 32 is entirely within a coverage area (or entirely overlaps) of the conductive coil 233*a* from a top view perspective. In some embodiments, a center of the portion 322*a* of the conductive layer 32 is designed to align with a center of the conductive coil 233*a*.

An etching operation 61 may be subsequently performed on the conductive layer 32. Specifically, the etching operation 61 may target the portion 322*a* of the conductive layer 32 exposed through the mask layer 41. In some embodiments, the etching operation 61 includes a dry etching operation. In some embodiments, the dry etching operation includes an ion beam etching (IBE), a reactive ion etching (RIE), a directional plasma etching, or a combination thereof. A thickness of the portion 322*a* is reduced from the thickness 94 to a thickness 95. In some embodiments, a duration of the etching operation is controlled to achieve a desired thickness of the portion 322*a* of the conductive layer 32. In some embodiments, the conductive layer 32 includes a thickness 95 in a range of 1 to 400 nm. In some embodiments, a recess 53 is defined at the portion 322*a* of the conductive layer 32. As shown in FIG. 8, the recess 53 may be entirely within a coverage area (or entirely overlaps) of the conductive coil 233*a* from a top view.

Figure 9:
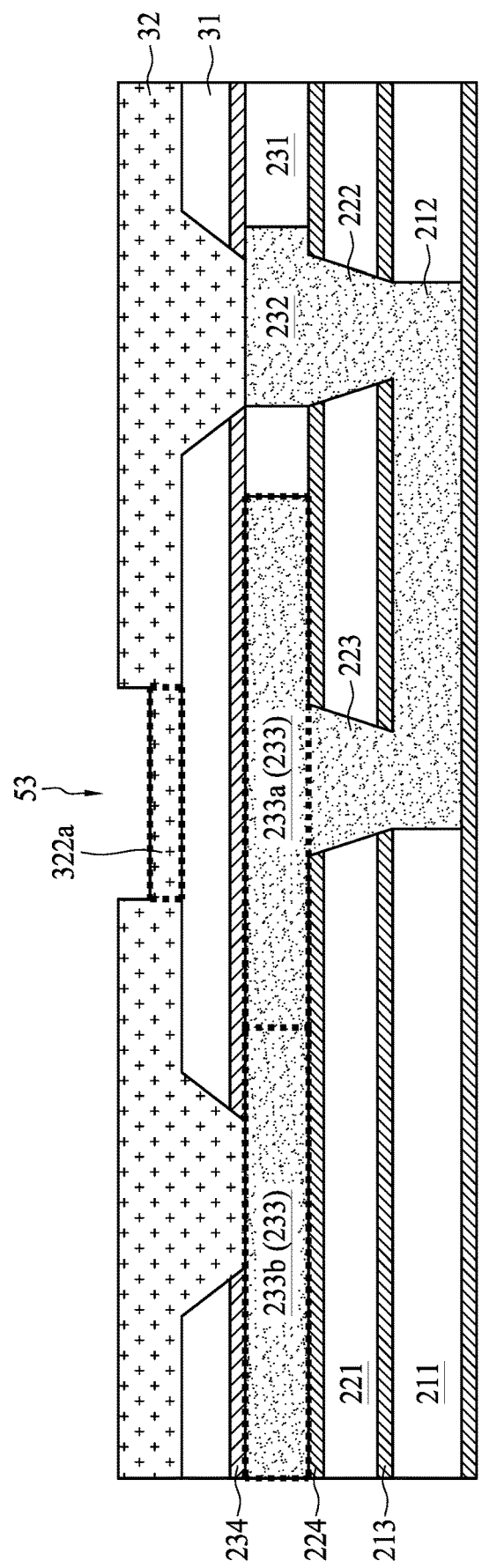

Please refer to FIG. 9, which is a schematic cross-sectional diagram of the semiconductor structure at a stage of the method 700 and/or a stage of the method 800 in accordance with some embodiments of the present disclosure. After the operation 704 and/or after the thickness reduction of the portion 322*a* of the conductive layer 32, the mask layer 41 is removed. In some embodiments, a wet etching operation is performed to remove the mask layer 41.

In some embodiments, a selective dry etching operation is performed to remove the mask layer 41.

Figure 10:
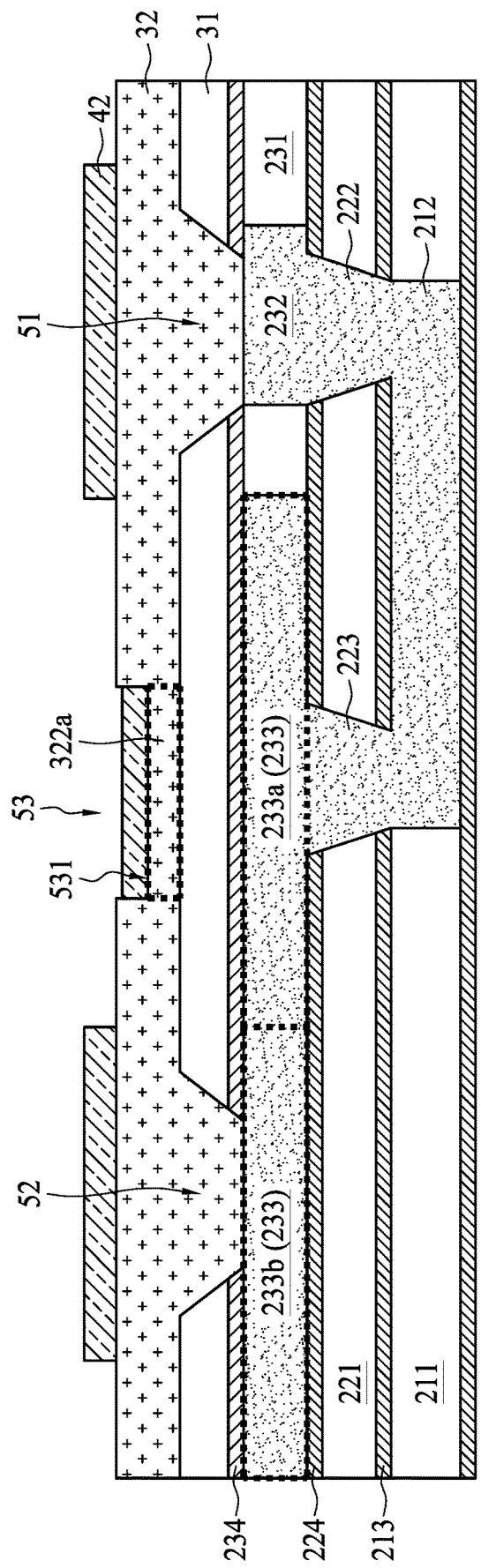

Please refer to FIG. 10, which is a schematic cross-sectional diagram of the semiconductor structure at a stage of the method 700 and/or a stage of the method 800 in accordance with some embodiments of the present disclosure. After the removal of the mask layer 41, a mask layer 42 is formed over the conductive layer 32. The mask layer 42 is configured to define positions of conductive terminals to be formed and also to protect the portion 322*a* of the conductive layer 32 having a reduced thickness (e.g. the thickness 95) during a patterning operation to be subsequently performed. In some embodiments, the mask layer 42 covers portions of the conductive layer 32 that fill the openings 51 and 52. In some embodiments, the mask layer 42 covers an entirety of the opening 51 and an entirety of the opening 52 from a top view perspective. In some embodiments, the mask layer 42 fills the recess 53. In some embodiments, the mask layer 42 covers at least a portion of a bottom surface 531 of the recess 53. In some embodiments, the mask layer 42 covers an entirety of the bottom surface 531 of the recess 53. In some embodiments, a portion of the mask layer 42 is entirely within the recess 53. The mask layer 42 may include a material same as or different from that of the mask layer 41. In some embodiments, the mask layer 42 includes photoresist material, nitride, oxynitride, or other suitable materials.

Figure 11:
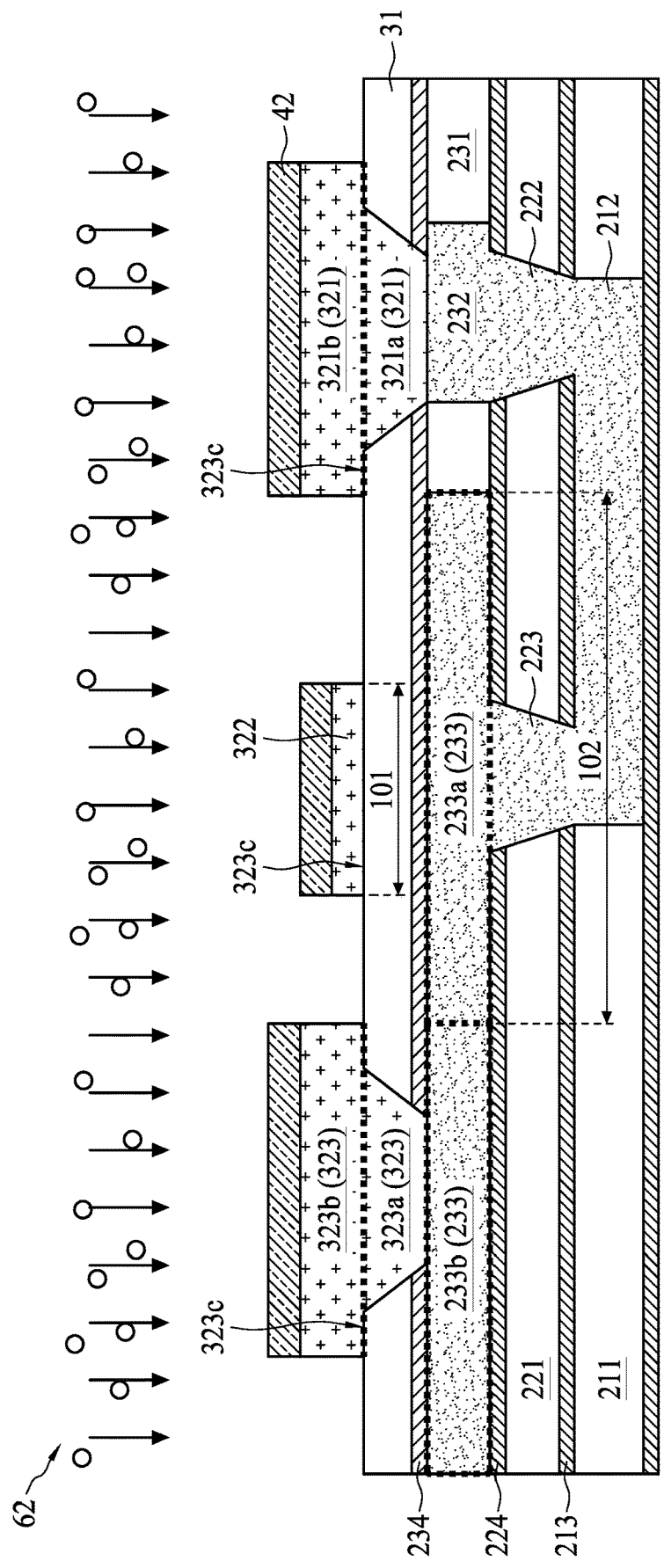

Please refer to FIG. 11, which is a schematic cross-sectional diagram of the semiconductor structure at a stage of the method 700 and/or a stage of the method 800 in accordance with some embodiments of the present disclosure. In the operation 705 and/or in the operation 802, the conductive layer 32 is patterned, and a conductive material 322 is formed. In some embodiments, an etching operation 62 is performed on the conductive layer 32 to remove a portion of the conductive layer 32 exposed through the mask layer 42. In some embodiments, the etching operation 62 includes a dry etching operation. In some embodiments, the dry etching operation includes an ion beam etching (IBE), a reactive ion etching (RIE), a directional plasma etching, or a combination thereof. In some embodiments, the portion 322*a* of the conductive layer 32 covered by the portion of the mask layer 42 in the recess 53 shown in FIG. 10 becomes a conductive material 322. In some embodiments, the conductive material 322 is electrically isolated from the metal line layer Mn. In some embodiments, the conductive material 322 is physically separated from the metal line layer Mn. In some embodiments, the conductive material 322 is vertically over the conductive coil 233*a*. In some embodiments, the conductive material 322 at least partially overlaps the conductive coil 233*a*. In some embodiments, the conductive material 322 entirely overlaps the conductive coil 233*a*. In other words, the conductive material 322 is partially in or entirely within a coverage area of the conductive coil 233*a*. In some embodiments, a ratio between a width 101 of the conductive material 322 and a width 102 of the conductive coil 233*a* is in a range of 1 and 100. In some embodiments, the width 101 is in a range of 10 and 5000 nm.

In some embodiments, conductive terminals 321 and 323 are defined by the patterning operation performed on the conductive layer 32 shown in FIG. 10 and formed concurrently with the conductive material 322. It should be noted that more conductive terminals can be formed by the patterning operation, and only the conductive terminals 321 and 323 are depicted in the figures and described in the specification for a purpose of illustration. In some embodiments, the conductive material 322 is disposed between the conductive terminals 321 and 323. In some embodiments, a portion of the conductive terminal 321 disposed in the opening 51 (shown in FIG. 6) is defined as a via portion 321*a* of the conductive terminal 321. In some embodiments, a portion of the conductive terminal 321 disposed above the passivation layer 31 is defined as a pad portion 321*b*. In some embodiments, a portion of the conductive terminal 323 disposed in the opening 52 (shown in FIG. 6) is defined as a via portion 323*a* of the conductive terminal 323. In some embodiments, a portion of the conductive terminal 323 disposed above the passivation layer 31 is defined as a pad portion 323*b*. In some embodiments, a bottom surface 321*c* of the pad portion 321*b*, a bottom surface 322*c* of the conductive material 322, and a bottom surface 323*c* of the pad portion 323*b* are substantially aligned. In some embodiments, the via portion 321*a* is tapered from the pad portion 321*b* toward the metal line 232. In some embodiments, the pad portion 321*b* covers an entirety of the via portion 321*a*. In some embodiments, the via portion 323*a* is tapered from the pad portion 323*b* toward the metal line 233*b*. In some embodiments, the pad portion 323*b* covers an entirety of the via portion 323*a*. In some embodiments, the conductive material 322 is electrically isolated from all conductive terminals (including the conductive terminals 321 and 323) formed by the patterning operation. In some embodiments, the conductive material 322 is physically separated from all of the conductive terminals (including the conductive terminals 321 and 323).

Figure 12:
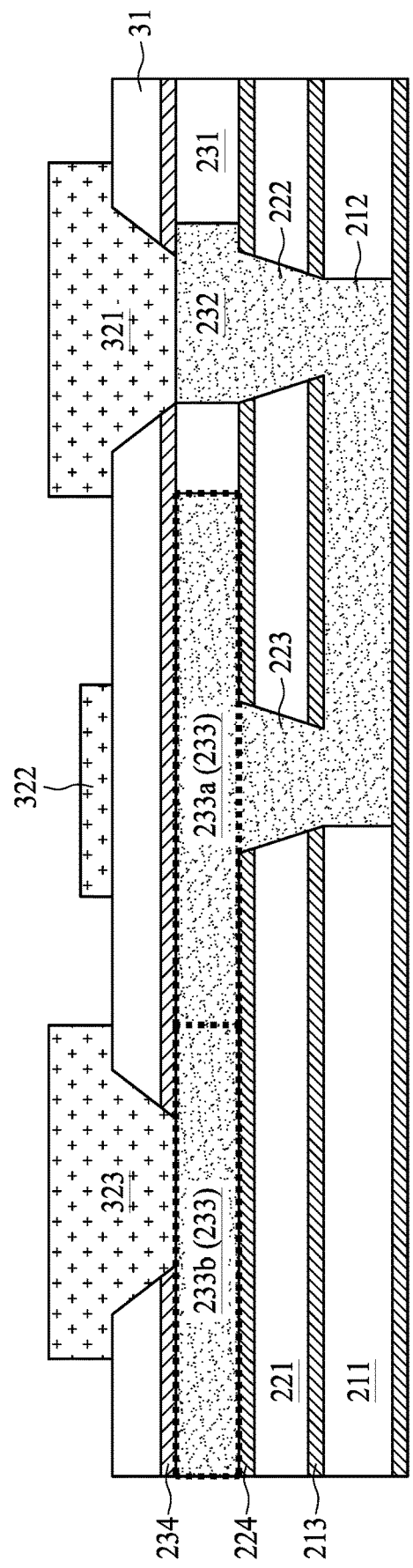

Please refer to FIG. 12, which is a schematic cross-sectional diagram of the semiconductor structure at a stage of the method 700 and/or a stage of the method 800 in accordance with some embodiments of the present disclosure. After the operation 705 and/or after the operation 802, the mask layer 42 is removed. In some embodiments, a wet etching operation is performed to remove the mask layer 42. In some embodiments, a selective dry etching operation is performed to remove the mask layer 42.

Figure 13B:
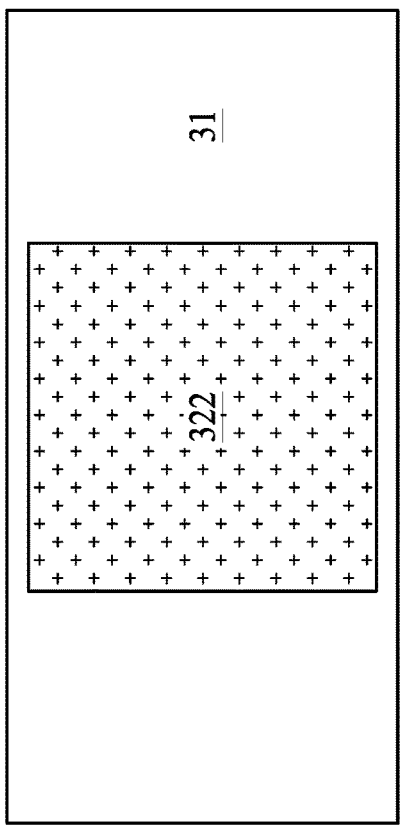
FIGS. 13A, 13B, 13C and 13D are schematic top view perspectives of a conductive material of a semiconductor structure in accordance with different embodiments of the disclosure.
Figure 13D:
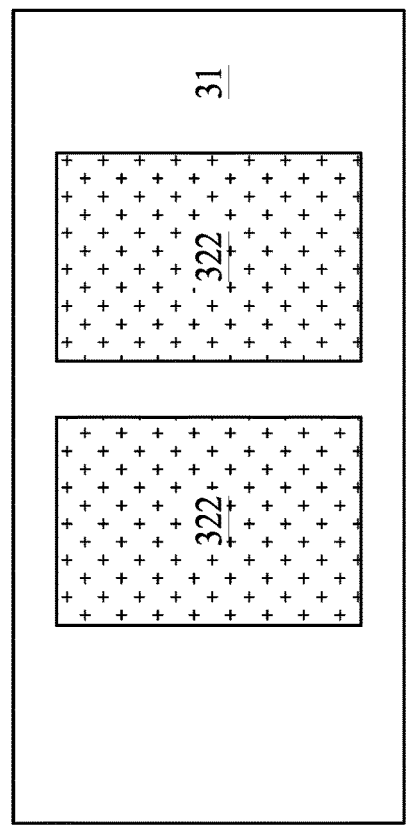
Figure 13A:
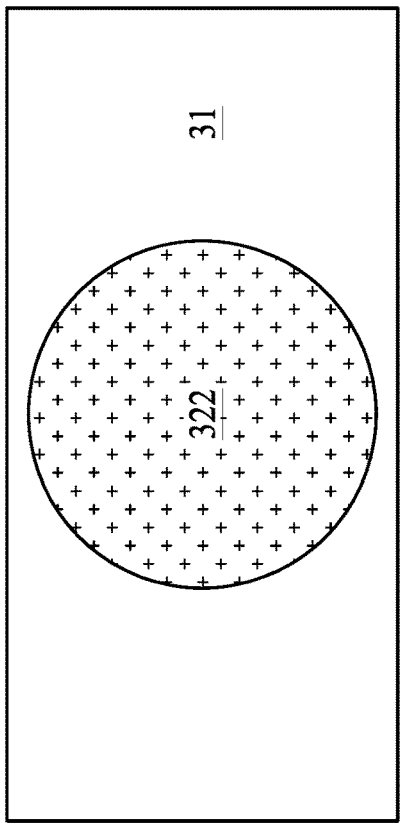
Figure 13C:
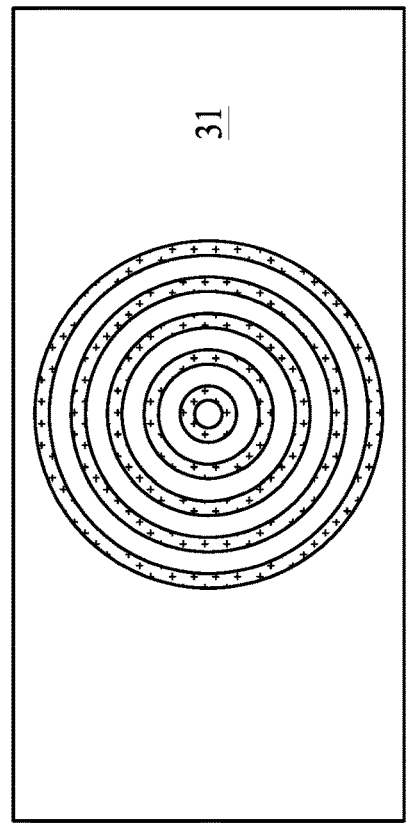

Please refer to FIGS. 13A to 13D, which are schematic top views of the conductive material 322 of the semiconductor structure in accordance with different embodiments of the present disclosure. In some embodiments, the conductive material 322 is a circle as shown in FIG. 13A. In some embodiments, the conductive material 322 is a rectangle as shown in FIG. 13B. A configuration of the conductive material 322 can be other shapes according to different applications, and are not limited herein. In some embodiments, the conductive material 322 can include multiple portions, and the portions of the conductive material 322 are electrically isolated and physically separated from one another. In some embodiments, the conductive material 322 includes multiple concentric rings as shown in FIG. 13C. In some embodiments, the conductive material 322 includes multiple rectangular portions substantially parallel to one another as shown in FIG. 13D. FIGS. 13A to 13D are exemplary embodiments, and a configuration of the conductive material 322 is not limited herein.

Figure 14:
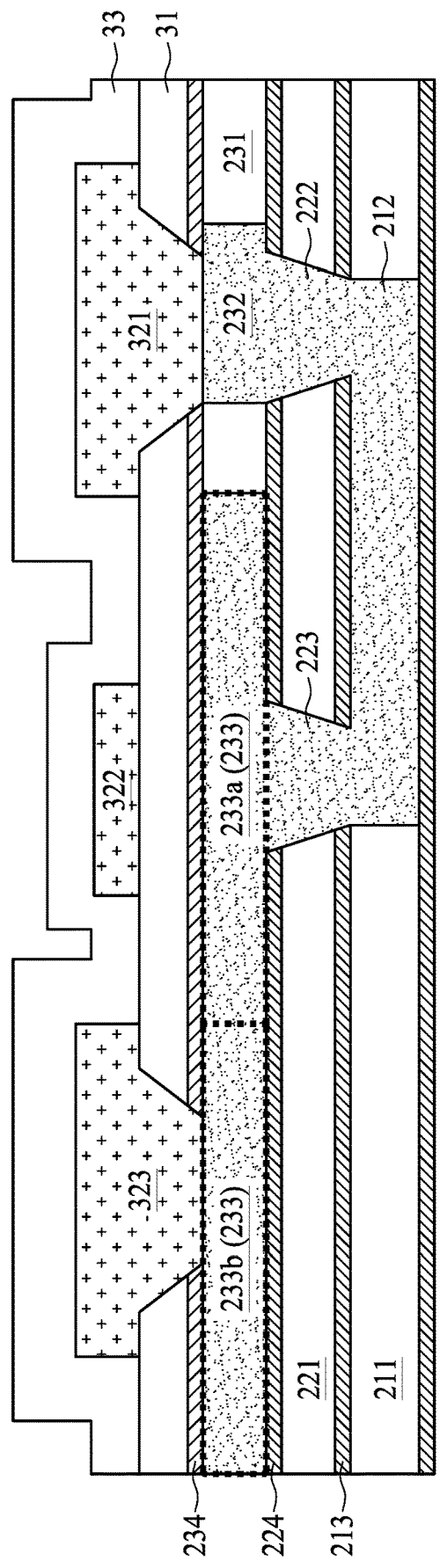
FIGS. 14 to 22 are schematic cross-sectional diagrams of a semiconductor structure at different stages of a manufacturing method in accordance with some embodiments of the disclosure.

Please refer to FIG. 14, which is a schematic cross-sectional diagram of the semiconductor structure at a stage of the method 700 and/or a stage of the method 800 in accordance with some embodiments of the present disclosure. After the removal of the mask layer 42, a passivation layer 33 is formed over the conductive material 322 and the conductive terminals 321 and 323. In some embodiments, the passivation layer 33 is formed by a conformal deposition. In some embodiments, a profile of the passivation layer 33 is conformal to a profile of the conductive material 322, the conductive terminals 321 and 323 and the passivation layer 31.

Figure 15:
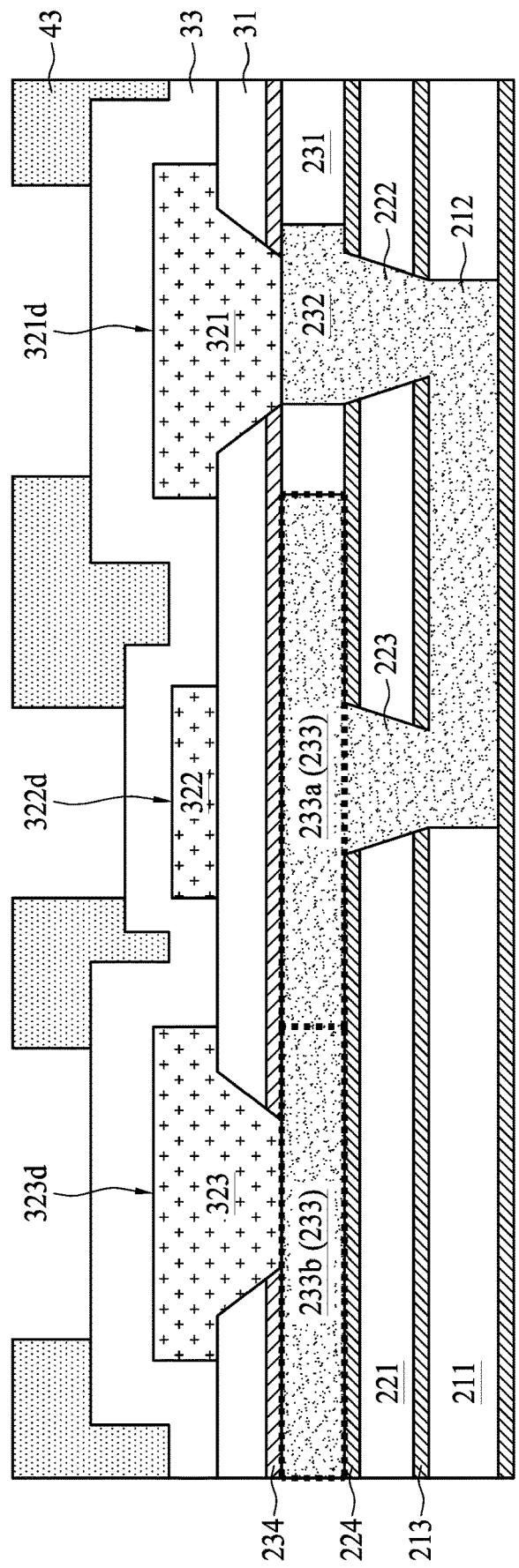

Please refer to FIG. 15, which is a schematic cross-sectional diagram of the semiconductor structure at a stage of the method 700 and/or a stage of the method 800 in accordance with some embodiments of the present disclosure. After the formation of the passivation layer 33, a mask layer 43 is formed over the passivation layer 33. The mask layer 43 is configured to define portions of the passivation layer 33 for electrical isolation of the conductive terminals (including 321 and 323) and the conductive material 322 from other electrical elements to be formed or disposed thereon. In some embodiments, the mask layer 43 is configured to define at least a portion of a top surface 321d of the conductive terminal 321 to be exposed. In some embodiments, the mask layer 43 is configured to define at least a portion of a top surface 322d of the conductive material 322 to be exposed. In some embodiments, the mask layer 43 is configured to define at least a portion of a top surface 323d of the conductive terminal 323 to be exposed. The mask layer 43 may include a material same as or different from that of the mask layer 42 and/or that of the mask layer 41. In some embodiments, the mask layer 43 includes photoresist material, nitride, oxynitride, or other suitable materials.

Figure 16:
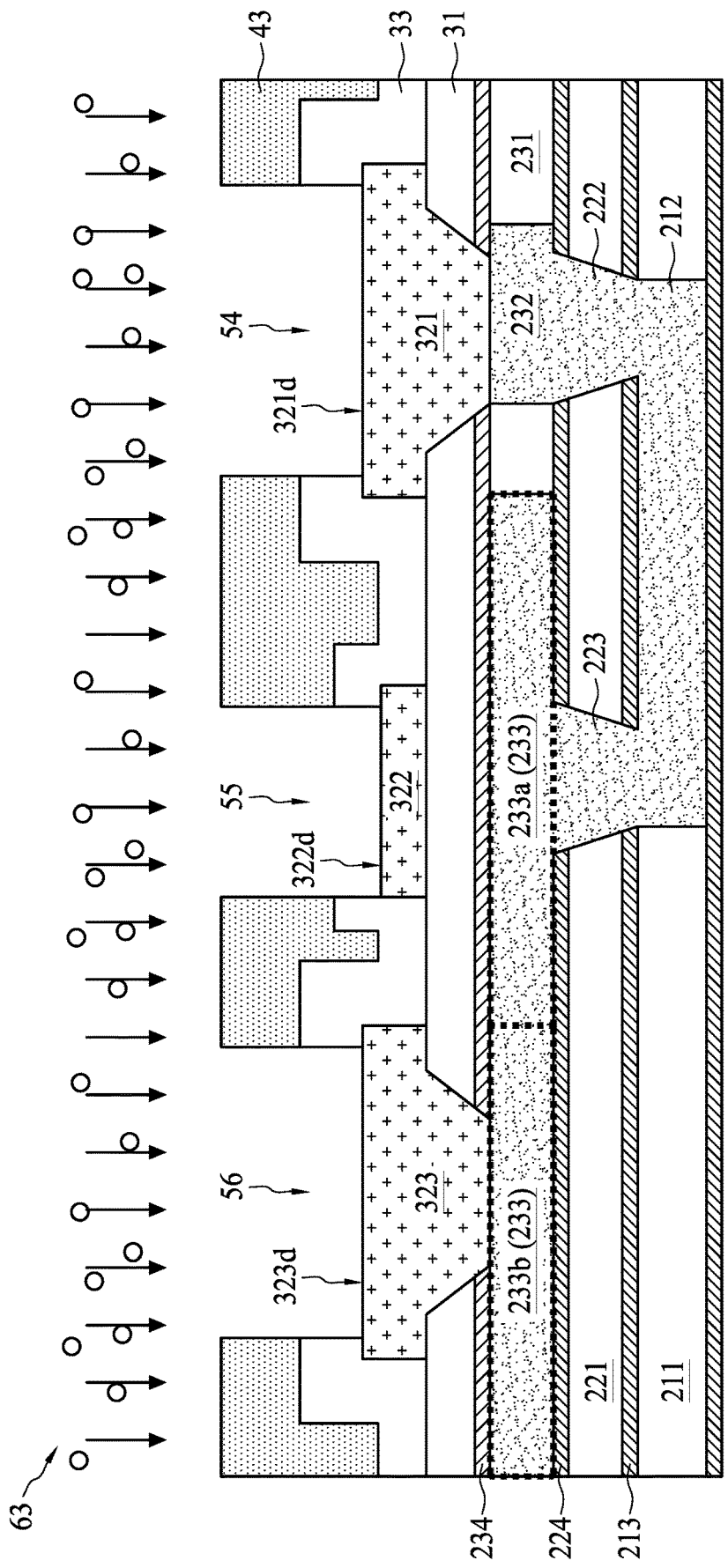

Please refer to FIG. 16, which is a schematic cross-sectional diagram of the semiconductor structure at a stage of the method 700 and/or a stage of the method 800 in accordance with some embodiments of the present disclosure. After the formation of the mask layer 43, the passivation layer 33 is patterned using the mask layer 43 as a mask. In some embodiments, at least a portion of the top surface 321d of the conductive terminal 321 is exposed through an opening 54 formed in the passivation layer 33 over the conductive terminal 321. In some embodiments, at least a portion of the top surface 322d of the conductive material 322 is exposed through an opening 55 formed in the passivation layer 33 over the conductive material 322. In some embodiments, at least a portion of the top surface 323d of the conductive terminal 323 is exposed through an opening 56 formed in the passivation layer 33 over the conductive terminal 323. In some embodiments, the passivation layer 33 is patterned by an etching operation 63. In some embodiments, the etching operation 63 includes a dry etching operation. In some embodiments, the dry etching operation includes an ion beam etching (IBE), a reactive ion etching (RIE), a directional plasma etching, or a combination thereof.

Figure 17:
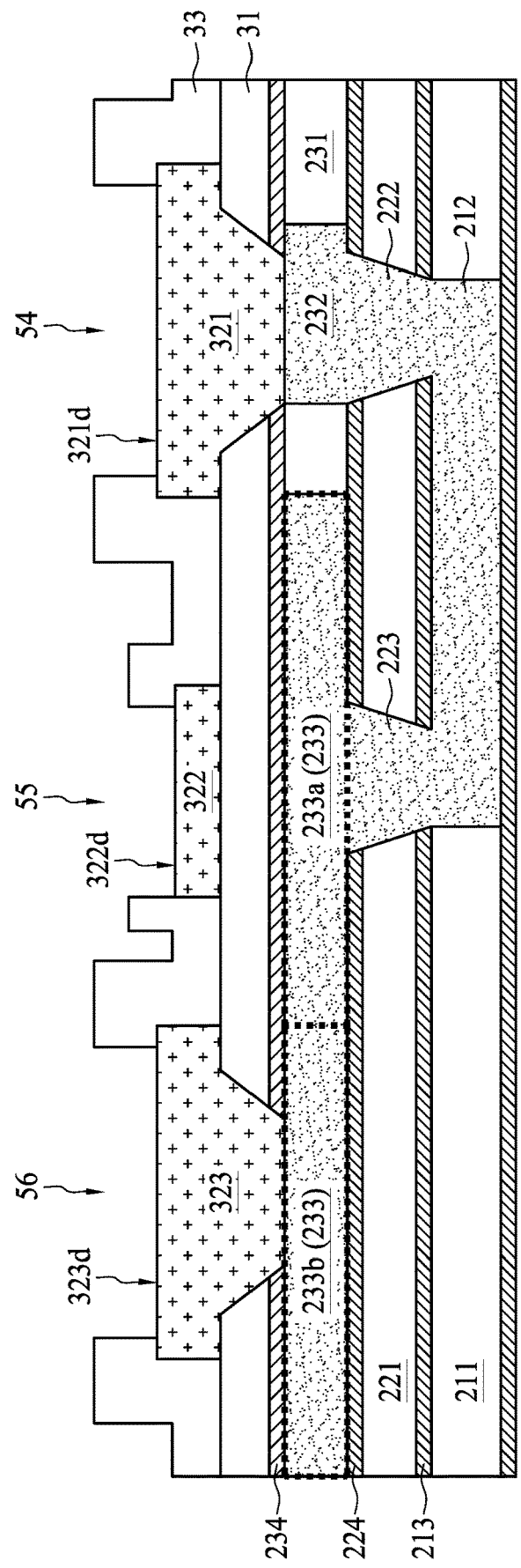

Please refer to FIG. 17, which is a schematic cross-sectional diagram of the semiconductor structure at a stage of the method 700 and/or a stage of the method 800 in accordance with some embodiments of the present disclosure. After the patterning of the passivation layer 33, the mask layer 43 is removed. In some embodiments, a wet etching operation is performed to remove the mask layer 43. In some embodiments, a selective dry etching operation is performed to remove the mask layer 43. In some embodiments, a peripheral portion of the conductive terminal 321 is covered by the passivation layer 33. In some embodiments, a peripheral portion of the conductive material 322 is covered by the passivation layer 33. In some embodiments, a peripheral portion of the conductive terminal 323 is covered by the passivation layer 33. However, the present disclosure is not limited thereto. In some embodiments, an entirety of the top surface 321d, 322d or 323d can be exposed through the passivation layer 33, as shown in FIG. 1. The passivation layer 33 is configured to provide electrical isolation between the conductive terminals (including 321 and 323) and/or between the conductive terminals and the conductive material 322.

Figure 18:
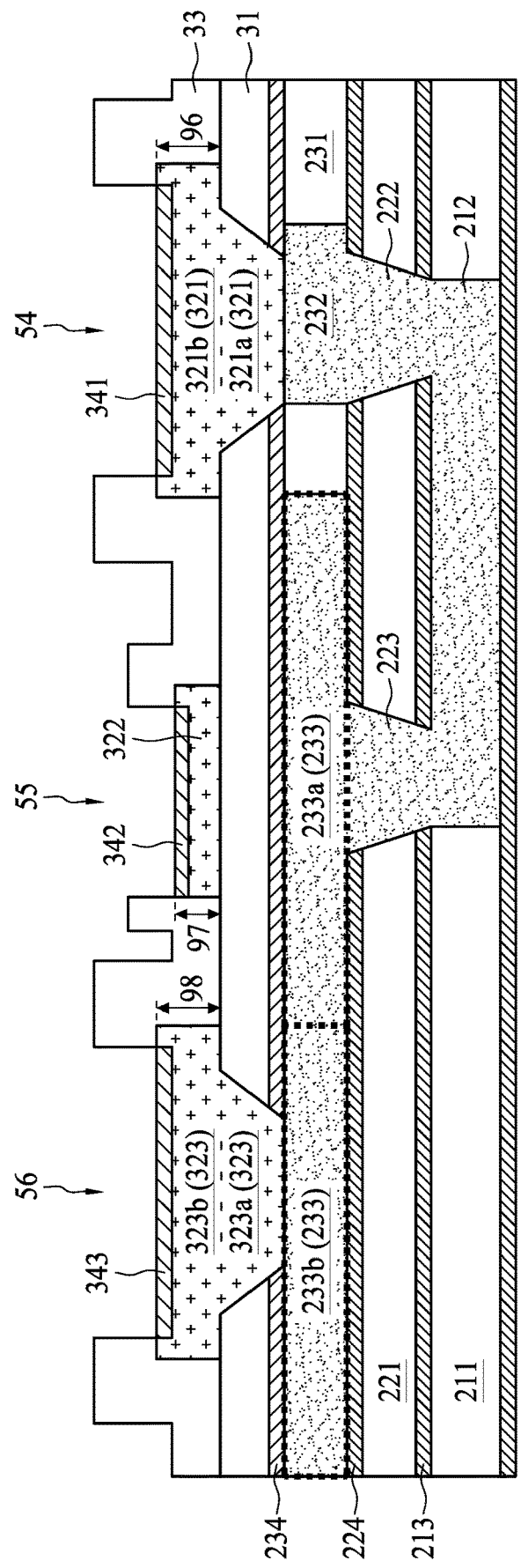

Please refer to FIG. 18, which is a schematic cross-sectional diagram of the semiconductor structure at a stage of the method 700 and/or a stage of the method 800 in accordance with some embodiments of the present disclosure. In the operation 706 and/or prior to the operation 803, oxide layers 341, 342 and 343 are formed at the exposed surfaces of the conductive terminals 321 and 323 and the conductive material 322. In some embodiments, the oxide layers 341, 342 and 343 are formed after the removal of the mask layer 43. In some embodiments, the oxide layers 341, 342 and 343 are formed during the removal of the mask layer 43. In some embodiments, the oxide layers 341, 342 and 343 are formed by oxidation of at least portions of surficial portions of the pad portion 321b of the conductive terminal 321, the conductive material 322, and the pad portion 323b of the conductive terminal 323 respectively. In some embodiments, the conductive material 322 is entirely oxidized, and a thickness of the conductive material 322 is substantially zero.

In some embodiments, thicknesses of the oxide layers 341, 342 and 343 are substantially equal. In some embodiments, the thickness of the oxide layer 341, 342 or 343 is in a range of 1 to 100 nm. In some embodiments, a total thickness 96 of a thickness of the oxide layer 341 and a thickness of the pad portion 321b below the oxide layer 341 is substantially equal to the thickness 94 shown in FIG. 7. In some embodiments, a total thickness 97 of a thickness of the oxide layer 342 and a thickness of the conductive material 322 below the oxide layer 342 is substantially equal to the thickness 95 shown in FIG. 8. In some embodiments, a total thickness 98 of a thickness of the oxide layer 343 and a thickness of the pad portion 323b below the oxide layer 343 is substantially equal to the total thickness 96. In some embodiments, a ratio of the total thickness 97 to the thickness of the oxide layer 342 is designed to be in a range of 1:1 to 30:1. In some embodiments, the ratio of the total thickness 97 to the thickness of the oxide layer 342 is designed to be in a range of 2:1 to 20:1.

Figure 19:
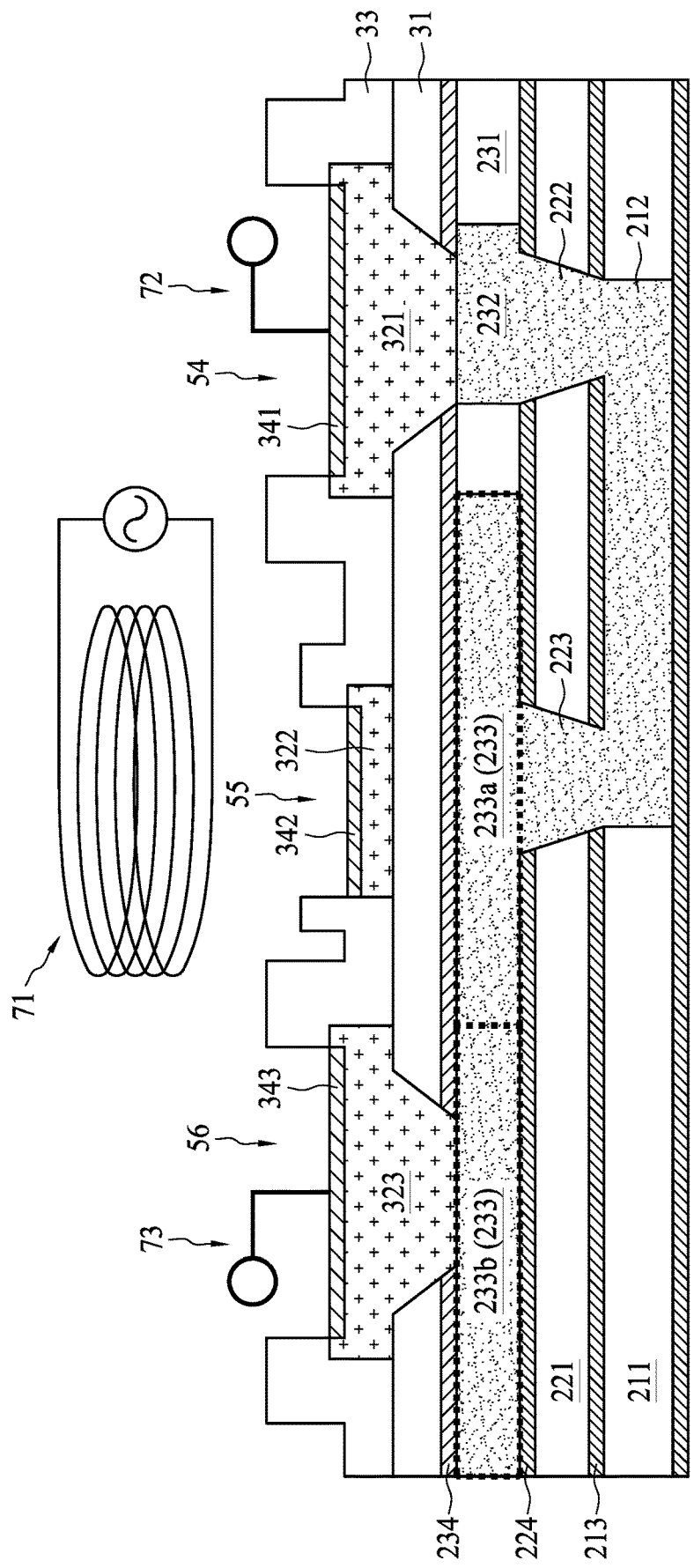

Please refer to FIG. 19, which is a schematic cross-sectional diagram of the semiconductor structure at a stage of the method 700 and/or a stage of the method 800 in accordance with some embodiments of the present disclosure. After the operation 706 and/or in the operation 803, an exciting coil 71 is provided over the conductive material 322. In some embodiments, the exciting coil 71 is electrically connected to an alternating current. In some embodiments, a magnetic field of the exciting coil 71 is in a range of 0.05 to 10 Tesla (T). In some embodiments, a measuring probe 72 is provided over the conductive terminal 321 prior to, concurrently with, or after the operation 706 and/or the operation 803. In some embodiments, a measuring probe 73 is provided over the conductive terminal 323 prior to, concurrently with, or after the providing of the measuring probe 72. In some embodiments, the measuring probe 72 and the measuring probe 73 are electrically connected to the conductive coil 233a in order to measure an induced current.

Figure 20:
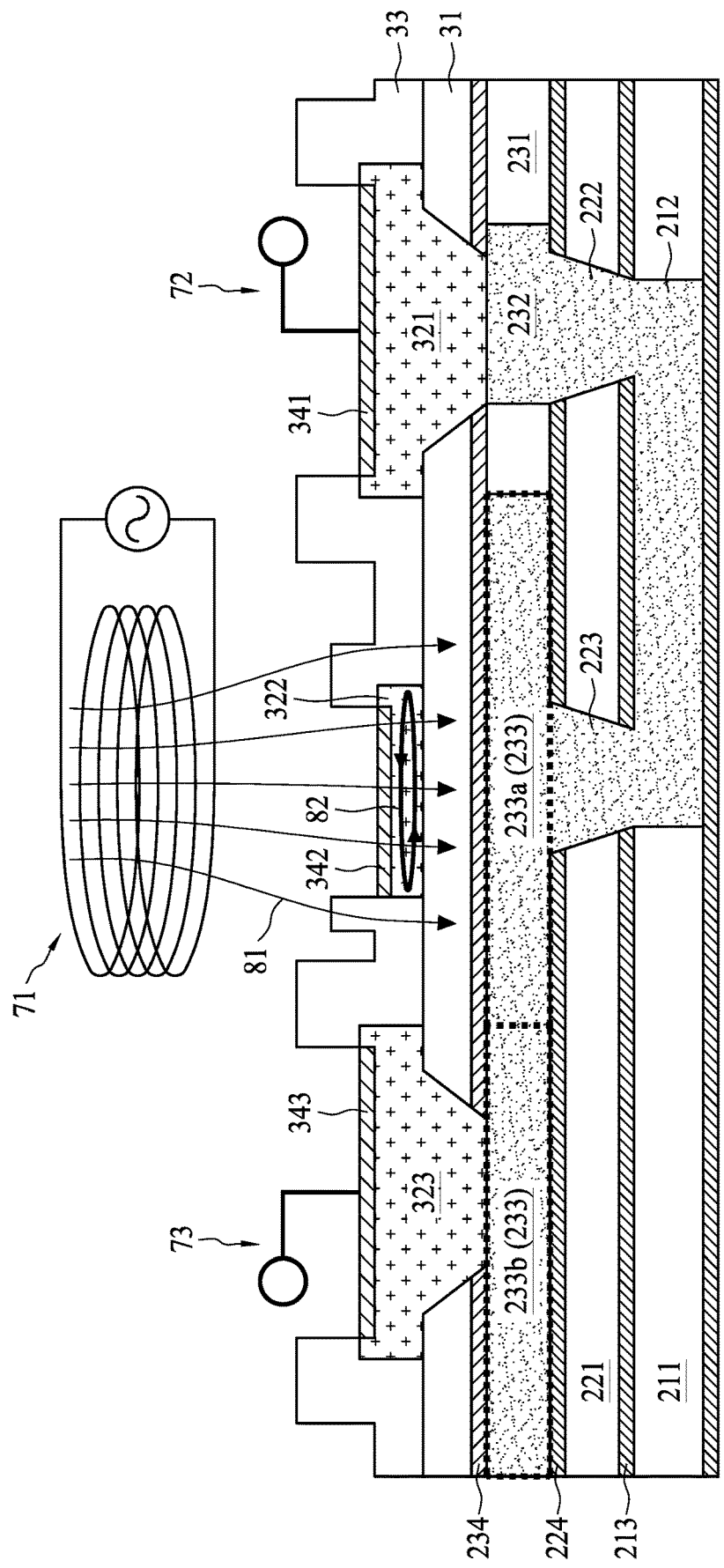

Please refer to FIG. 20, which is a schematic cross-sectional diagram of the semiconductor structure at a stage of the method 700 and/or a stage of the method 800 in accordance with some embodiments of the present disclosure. After the providing of the exciting coil 71 and/or prior to the operation 804, an Eddy current 82 (indicated as a circle with arrows in the conductive material 322) is generated in the conductive material 322 by a changing magnetic field 81 (indicated as curved arrows from the exciting coil 71 toward the conductive material 322) of the exciting coil 71. In some embodiments, an intensity of the Eddy current 82 induced in the conductive material 322 is related to a surficial roughness of the oxide layer 342. In some embodiments, the intensity of the Eddy current 82 induced in the conductive material 322 is related to the thickness of the oxide layer 342. In some embodiments, the thickness and/or the roughness of the oxide layer 342 can indicate a thickness and/or a roughness of the oxide layer 341 or 343 formed on the conductive terminal 321 or 323.

Figure 21:
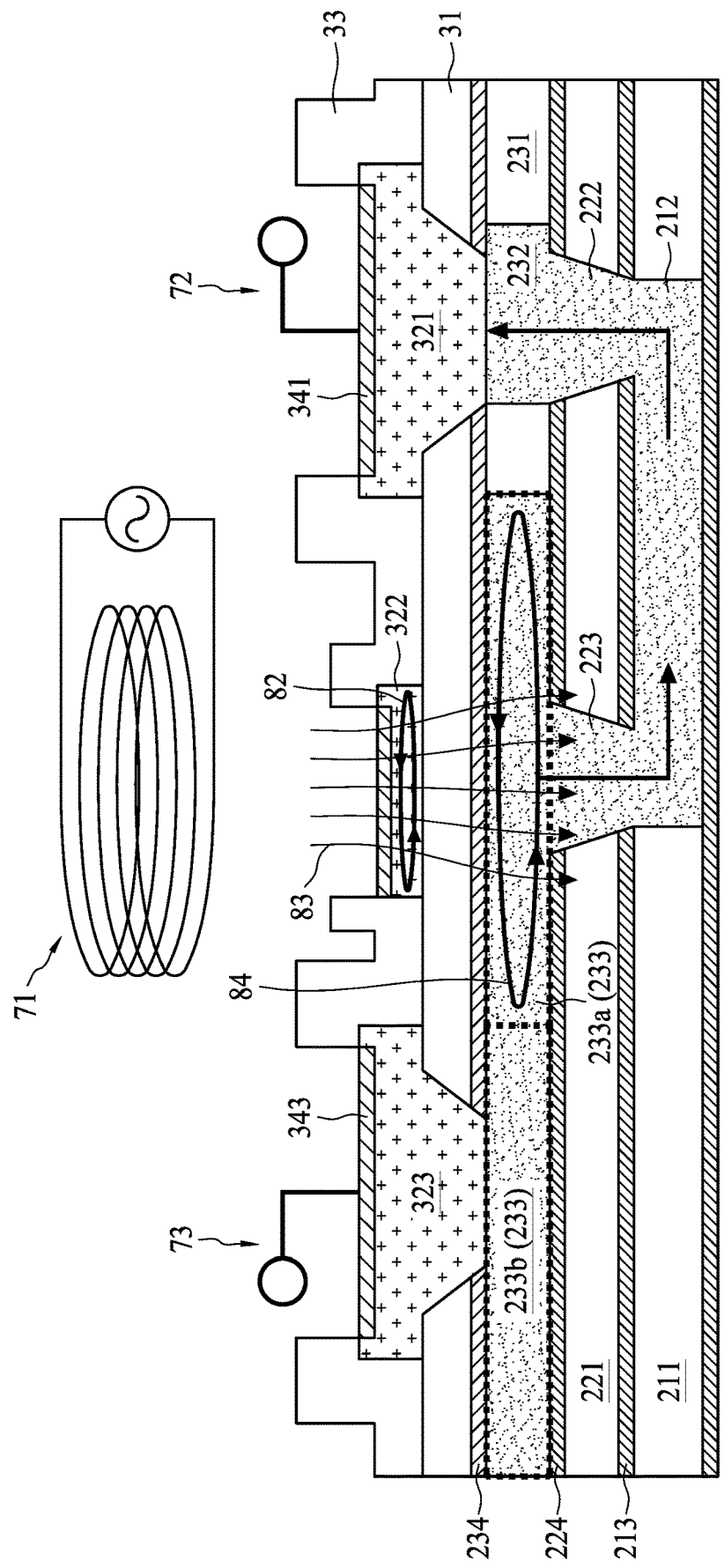

Please refer to FIG. 21, which is a schematic cross-sectional diagram of the semiconductor structure at a stage of the method 700 and/or a stage of the method 800 in accordance with some embodiments of the present disclosure. After the generation of the Eddy current 82 and/or in the operation 804, an induced current 84 is generated in the conductive coil 233*a*. The induced current 84 (indicated as a circle with arrows in the conductive coil 233*a*) may be induced by an electrical field (indicated as curved arrows from the conductive material 322 toward the conductive coil 233*a*) of the Eddy current 82 in the conductive material 322. The conductive coil 233*a* is configured to receive the electrical filed of the Eddy current 82 in the conductive material 322 as much as possible. In some embodiments, the conductive coil 233*a* is configured to receive an entirety of the electrical filed of the Eddy current in the conductive material 322.

After the generation of the induced current and/or in the operation 805, the induced current 84 is measured through the conductive terminals 321 and 323. In some embodiments, the induced current 84 flows to the conductive terminal 321 or the conductive terminal 323 through the related metal lines and metal vias. In some embodiments, as shown in FIG. 21, the flow of the induced current 84 is indicated with arrows, and the induced current 84 flows to the conductive terminal 323 through the metal via 223, the metal line 212, the metal via 222, and the metal line 232. An intensity of the induced current 84 can represent an intensity of the Eddy current 82. In some embodiments, the intensity of the induced current 84 is correlated to an electrical resistance of a conductive terminal (e.g., 321 or 323). In some embodiments, the intensity of the induced current 84 is correlated to a thickness of an oxide layer (e.g., 341 or 343) over the conductive terminal (e.g., 321 or 323). Data of the electrical resistance of the conductive terminal and/or the thickness of the oxide layer over the conductive terminal can be used for future improvement of the manufacturing procedure. In some embodiments the conductive material 322 entirely oxidized, none Eddy current is generated, and the detection on the induced current is not available.

Figure 22:
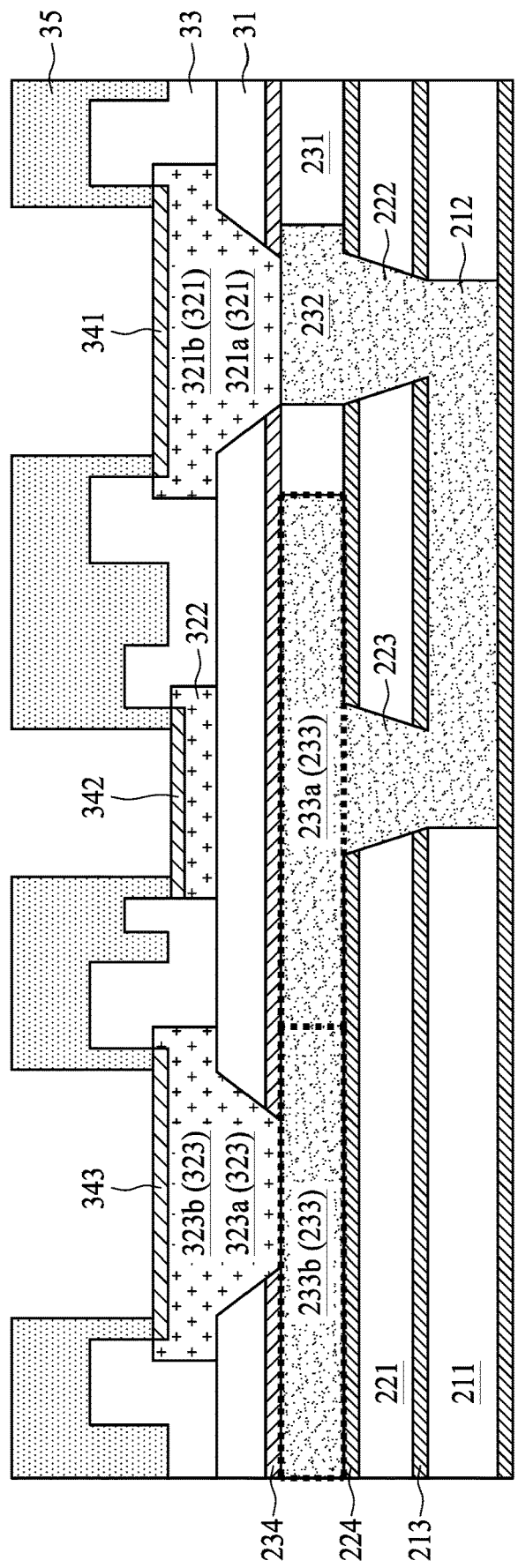

Please refer to FIG. 22, which is a schematic cross-sectional diagram of the semiconductor structure at a stage of the method 700 and/or a stage of the method 800 in accordance with some embodiments of the present disclosure. After the correlation and/or after the operation 806, a stress buffering layer 35 is formed over the passivation layer 33. In some embodiments, the stress buffering layer 35 covers an entirety of the passivation layer 33. In some embodiments, the stress buffering layer 35 covers a peripheral portion of the oxide layer 341, a peripheral portion of the oxide layer 342, and a peripheral portion of the oxide layer 343. In some embodiments, the stress buffering layer 35 includes polyimide. In some embodiments, the semiconductor structure shown in FIG. 22 is moved to another chamber for bonding with another wafer, other chips, or other electrical devices.

The present disclosure provides a manufacturing method of a semiconductor structure and a semiconductor structure thereof. The method includes forming a conductive material concurrently with, and at a same layer as, one or more conductive terminals over an interconnection structure for bonding. The conductive material is configured to provide an indirect measurement of a conductivity and/or an electrical resistance of the conductive terminals. Since oxide layers may be formed over the conductive terminals after a wet etching operation and/or prior to bonding with other electrical devices, the conductivity and/or the electrical resistance of the conductive terminals may be altered, and a product performance can be adjusted. It is necessary to provide a precise measurement of the electrical resistance of the conductive terminals prior to the bonding. However, the conductive terminals may be damaged and a measurement may fail if a voltage is provided directly on the conductive terminals.

The conductive material of the present disclosure includes one or more isolated portions or pieces, and Eddy currents can be generated in the one or more isolated portions/pieces by an exciting coil. The method further includes formation of a conductive coil in a metal line layer of the interconnection structure. An induced current generated in the conductive coil by the Eddy currents can be detected and measured. The conductive coil can be formed in a topmost metal line layer, which is a metal line layer closest to the conductive material, for a purpose of a greater intensity of the induced current. In addition, the conductive coil is electrically connected to two conductive terminals adjacent to the conductive material for a purpose of minimizing a traveling distance of the induced current in order to minimize signal noises. In some embodiments, a distance between the two conductive terminals (e.g. the conductive terminals 321 and 322) is in a range of 0.1 to 500 microns (μm). However, the present disclosure is not limited thereto.

The conductive material undergoes a same manufacturing procedure as the conductive terminals, and a thickness and a roughness of an oxide layer formed on the conductive material can be similar to those of the oxide layers formed over the conductive terminals. Therefore, an intensity of the Eddy currents can indicate an electrical resistance of the conductive terminals, and an intensity of the induced current can be correlated to the electrical resistance of the conductive terminals. A precise measurement without damaging the conductive terminals can be provided.

It is observed that a thickness of the oxide layers formed by the oxidation of the conductive terminals may be in a range of 1 to 100 nm, and a thickness of the conductive material is controlled to be in a range of 1 to 300 nm. A ratio of a total thickness of the oxide layer and the conductive material to the thickness of the oxide layer is controlled in a range of 2:1 to 20:1 for ease of detection on a change in electrical resistances resulting from the oxide layer.

It should be noted that the thickness of the conductive material is not required to be less than a thickness of a pad portion of the conductive terminal as illustrated in the embodiments above as long as a ratio of the two thicknesses is within the above-mentioned range of 2:1 to 20:1. In more advanced generations with reduced thicknesses of the conductive terminals in the future, the operations as shown in FIGS. 8 to 9 can be omitted.

In accordance with some embodiments of the disclosure, a semiconductor structure is provided. The structure includes an interconnection structure, a first conductive pad, a second conductive pad, a conductive material and a conductive coil. The first and second conductive pads are disposed over and electrically connected to the interconnection structure individually. The conductive material is electrically isolated from the interconnection structure, wherein bottom surfaces of the conductive material, the first conductive pad and the second conductive pad are substantially aligned. The conductive coil is disposed in the interconnection structure and overlapped by the conductive material.

In accordance with some embodiments of the disclosure, a manufacturing method of a semiconductor structure is provided. The method includes a number of operations. A conductive coil is formed in an interconnection structure. A first passivation layer is formed over the interconnection structure. A conductive layer is formed over the first passivation layer. A thickness of a portion of the conductive layer is reduced. The conductive layer is then patterned, thereby forming a conductive material disposed between a first conductive pad and a second conductive pad, wherein a thickness of the conductive material is substantially less than a thickness of the first conductive pad or a thickness of the second conductive pad. An oxide layer is formed over the first conductive pad, the second conductive pad and the conductive material.

In accordance with some embodiments of the disclosure, a method for manufacturing a semiconductor structure is provided. The method may include several operations. A conductive coil is formed in an interconnection structure. A conductive material is formed vertically over the conductive coil. An exciting coil is provided over the conductive material. An induced current is generated in the conductive coil. The induced current is measured. An intensity of the induced current is correlated to an electrical resistance of a conductive pad disposed over the interconnection structure.

The foregoing outlines features of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a semiconductor structure, comprising:
    forming a conductive coil in an interconnection structure;
    forming a first passivation layer over the interconnection structure;
    forming a conductive layer over the first passivation layer;
    reducing a thickness of a portion of the conductive layer;
    patterning the conductive layer, thereby forming a conductive material disposed between a first conductive pad and a second conductive pad, wherein a thickness of the conductive material is substantially less than a thickness of the first conductive pad or a thickness of the second conductive pad;
    forming an oxide layer over the first conductive pad, the second conductive pad and the conductive material;
    measuring an induced current in the conductive coil through the first conductive pad and the second conductive pad; and
    forming a stress buffering layer over the oxide layer, the first conductive pad, and the second conductive pad after the measuring of the induced current.

2. The manufacturing method of claim 1, further comprising:
    forming a first mask layer over the conductive layer, wherein the first mask layer leaves the portion of the conductive layer exposed; and
    performing a dry etching operation to reduce the thickness of the portion of the conductive layer.

3. The manufacturing method of claim 2, further comprising:
    forming a second mask layer over the conductive layer, wherein the second mask layer covers the portion of the conductive layer.

4. The manufacturing method of claim 1, further comprising:
    forming a second passivation layer, wherein top surfaces of the first conductive pad, the second conductive pad, and the conductive material are exposed prior to the formation of the oxide layer.

5. The method of claim 1, wherein the interconnection structure comprises a first conductive line and a second conductive line, wherein the first conductive line, the second conductive line and the conductive coil are in a same level.

6. The method of claim 5, wherein the conductive coil is formed prior to or after a formation of the first conductive line and the second conductive line.

7. The method of claim 5, wherein the conductive coil is formed concurrently with a formation of the first conductive line and the second conductive line.

8. A method for manufacturing a semiconductor structure, comprising receiving an interconnection structure comprising a conductive coil formed therein;
    forming a passivation layer over the interconnection structure;
    forming a conductive material over the passivation layer, wherein the conductive material overlaps the conductive coil;
    forming a first conductive pad and a second conductive pad over the passivation layer, wherein the first conductive pad comprises a first pad portion over the passivation layer and a first via portion penetrating the passivation layer, the second conductive pad comprises a second pad portion over the passivation layer and a second via portion penetrating the passivation layer, and a thickness of the first pad portion and a thickness of the second pad portion are greater than a thickness of the conductive material;
    measuring an induced current in the conductive coil through the first conductive pad and the second conductive pad; and
    forming a stress buffering layer over the oxide layer after the measuring of the induced current, wherein the first conductive pad and the second conductive pad are electrically connected to the conductive coil.

9. The method of claim 8, wherein the conductive material is separated from the first conductive pad and the second conductive pad.

10. The method of claim 8, wherein the forming of the conductive material further comprises:
    forming a conductive layer over the passivation layer;
    forming a mask layer over the conductive layer, wherein the mask layer exposes a first portion of the conductive layer and covers second portions of the conductive layer;
    etching the first portion of the conductive layer such that a thickness of the first portion of is less than a thickness of each second portion.

11. The method of claim 8, wherein the forming of the first conductive pad and the second conductive pad further comprises:
forming a first opening and a second opening separated from each other in the passivation layer;
forming a conductive layer over the passivation layer, wherein the first opening and the second opening are filled with the conductive layer;
forming a mask layer over portions of the conductive layer; and
etching the conductive layer through the mask layer to form the first conductive pad and the second conductive pad.

12. The method of claim 11, further comprising forming the first via portion in the first opening and the second via portion in the second opening.

13. The method of claim 8, wherein the first conductive pad is electrically connected to the conductive coil through the first via portion, and the second conductive pad is electrically connected to the conductive coil through the second via portion.

14. The method of claim 11, wherein the mask layer further covers the conductive material.

15. The method of claim 8, wherein the forming of the conductive material is prior to the forming of the first conductive pad and the second conductive pad.

16. A method for manufacturing a semiconductor structure, comprising receiving an interconnection structure, wherein the interconnection structure comprises a conductive coil, a first conductive line and a second conductive line;
forming a first passivation layer over the interconnection structure;
forming a conductive material over the first passivation layer, wherein the conductive material overlaps the conductive coil;
forming a first conductive pad coupled to the first conductive line and a second conductive pad coupled to the second conductive line over the passivation layer, wherein the first conductive pad and the second conductive pad are separated from the conductive material;
forming a second passivation layer over the conductive material, the first conductive pad and the second conductive pad; and
patterning the second passivation layer to form openings exposing the conductive material, the first conductive pad and the second conductive pad, wherein the first conductive pad comprises a pad portion over the first passivation layer and a via portion penetrating the first passivation layer, and a thickness of the pad portion of the first conductive pad is different from than a thickness of the conductive material, wherein the forming of the conductive material and the forming of the first conductive pad and the second conductive pad further comprises:
forming a conductive layer over the first passivation layer;
performing a first etching to remove a first portion of the conductive layer to form a recess in the conductive layer; and
performing a second etching to remove second portions of the conductive layer to form the conductive material over the conductive coil, and to form the first conductive pad and the second conductive pad.

17. The method of claim 16, wherein the thickness of the conductive material is less than a thickness of the first conductive pad and a thickness of the second conductive pad.

18. The method of claim 16, wherein the first conductive line is electrically connected to the conductive coil through metal vias and a third conductive line under the conductive coil.

19. The method of claim 16, wherein the second conductive line is in contact with the conductive coil.

20. The method of claim 16, further comprising forming an oxide layer over the first conductive pad, the second conductive pad and the conductive material through the openings of the second passivation layer.

* * * * *